(12) United States Patent
Ikeuchi et al.

(10) Patent No.: US 7,696,628 B2
(45) Date of Patent: Apr. 13, 2010

(54) RELAY SUBSTRATE AND SUBSTRATE ASSEMBLY

(75) Inventors: Tadashi Ikeuchi, Kawasaki (JP); Takatoshi Yagisawa, Kawasaki (JP); Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 191 days.

(21) Appl. No.: 12/010,878

(22) Filed: Jan. 30, 2008

(65) Prior Publication Data

US 2009/0029570 A1 Jan. 29, 2009

(30) Foreign Application Priority Data

Jan. 31, 2007 (JP) ............... 2007-021808

(51) Int. Cl.
*H01L 23/48* (2006.01)
(52) U.S. Cl. .................. 257/775; 257/776
(58) Field of Classification Search .......... 257/775, 257/776
See application file for complete search history.

(56) References Cited

U.S. PATENT DOCUMENTS

2004/0264882 A1   12/2004   Torigoe et al.
2005/0174190 A1   8/2005    Yagyu et al.
2009/0029570 A1*  1/2009    Ikeuchi et al. ............ 439/67

FOREIGN PATENT DOCUMENTS

JP   2004-247980   9/2004
JP   2005-26801    1/2005

\* cited by examiner

*Primary Examiner*—Mark Prenty
(74) *Attorney, Agent, or Firm*—Staas & Halsey LLP

(57) ABSTRACT

According to an aspect of an embodiment, a substrate for connecting circuit boards comprises: a substrate member having a first surface and a second surface facing each other and a first end and a second end facing each other; a first signal line formed on the first surface of the first end; a second signal line formed on the second surface of the second end; a third signal line connecting the first signal line with the second signal line; a first ground plane arranged on the first surface and surrounding the first signal line; and a portion of the second signal line formed over the first ground, the portion comprising narrower than an other portion of the second signal line.

6 Claims, 21 Drawing Sheets

RELAY SUBSTRATE AND SUBSTRATE ASSEMBLY

TECHNICAL FIELD

The present art relates to a relay substrate that relays connect between multi-layered substrates. However, the use of the present art does not limit the connection between the multi-layered substrates.

In an optical transmitting/receiving module, flexible printed circuits (FPC) are used for connection of a high-frequency signal between a multi-layered printed circuit board and an optical device. This art is showed by Laid-open Japanese Patent Application Number 2005-26801.

The flexible printed circuit can transmit data at a velocity higher than that of a normal wire. Further, the flexible printed circuit has flexibility to be greatly deformed, thereby adjusting positional deviation between the substrates to be connected.

A conventional printed circuit board on which an integrated circuit (IC) is mounted is connected to an optical device via a flexible printed circuit. Herein, the flexible printed circuit is directly connected to the printed circuit board.

However, in transfer at high velocity, such as 20 Gbps and 40 Gbps, the flexible printed circuit is directly connected to an electrode of the printed circuit board. Then, the influence of the printed circuit board changes an effective dielectric constant of a transfer path on the flexible printed circuit. As a consequence, there is a problem that impedance characteristic of the flexible printed circuit changes and a signal waveform thus deteriorates.

Further, the individual printed circuit boards are manufactured by forming a wiring on a large substrate with a mask and cutting the substrate. With this manufacturing method, positional precision for the cutting operation is low and it is not possible to precisely determine the wiring position with respect to the outer shape of the printed circuit board. Therefore, the electrode of the printed circuit board to be connected to the flexible printed circuit cannot be arranged just on the end of the printed circuit substrate.

Accordingly, there is a problem that the impedance characteristic of the flexible printed circuit changes and the signal waveform deteriorates.

SUMMARY

According to an aspect of an embodiment, a substrate for connecting circuit boards comprises:

a substrate member having a first surface and a second surface facing each other and a first end and a second end facing each other;

a signal line arranged from the first surface of the first end to the second surface of the second end; and a first ground arranged on the first surface and surrounding the signal line.

DETAILED DESCRIPTION OF THE INVENTION

Hereinbelow, a description will be given of a relay substrate and an optical communication module according to preferred embodiments with reference to the drawings.

It is an object of this embodiment to provide a relay substrate and an optical communication module that can improve transfer characteristics of a high-speed signal between multi-layered substrates.

Figure 1:
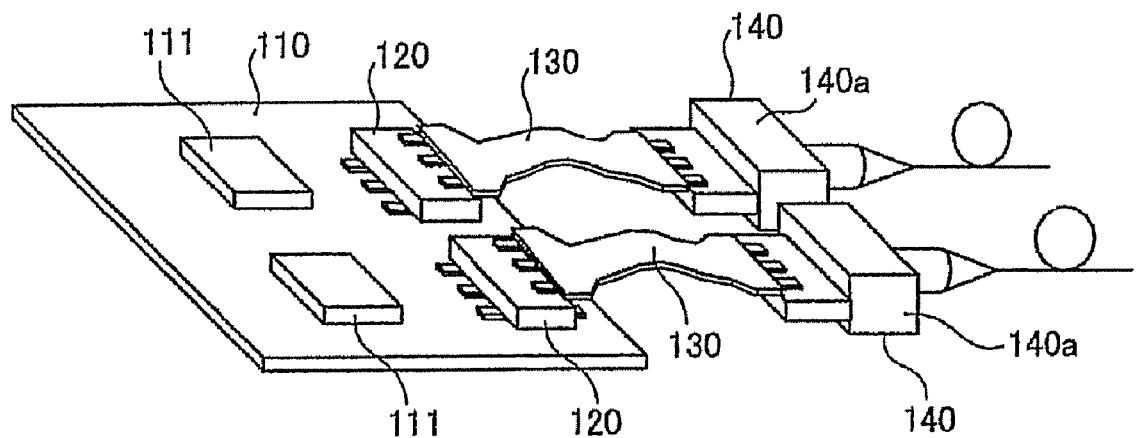
FIG. 1 is a perspective view showing a relay substrate according to an embodiment.

FIG. 1 is a perspective view showing a relay substrate according to an embodiment. Referring to FIG. 1, a printed circuit board 110 comprises: an IC 111; and a relay substrate 120. An optical device 140 (another circuit) comprises a flexible printed circuit 130. The flexible printed circuit 130 is connected to the relay substrate 120 of the printed circuit board 110. The relay substrate 120 can be processed up to the substrate end. Further, the relay substrate 120 is a ceramic substrate for determining the positional precision of an electrode. Furthermore, the relay substrate 120 has a dielectric constant higher than that of the printed circuit board 110.

The optical device 140 includes an optical element 140a. The optical device 140 is a device such as an LED (Light Emitting Diode) or an LD (Laser Diode) that converts an electrical signal output from the printed circuit board 110 into an optical signal and outputs the converted signal to another device. Further, the optical device 140 may be a device such as a PD (Photo Diode) that converts an optical signal output from another device into an electrical signal and outputs the converted signal to the printed circuit board 110.

The printed circuit board 110, the relay substrate 120, the flexible printed circuit 130, and the optical device 140 form an optical communication module that perform communication with another device. Referring to FIG. 1, the optical communication module is a device that executes transmission and reception. However, the optical communication module may be an optical transmitting module that executes transmission or an optical receiving module that executes reception.

Figure 2:
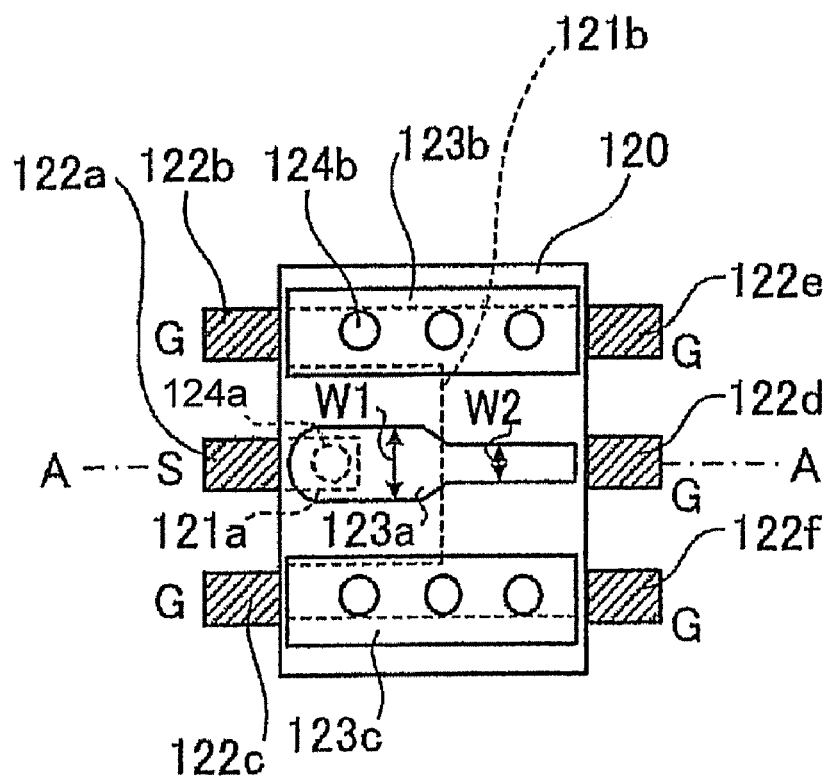
FIG. 2 is a plan view showing the relay substrate according to the embodiment.

FIG. 2 is a plan view showing the relay substrate according to the embodiment. As shown by a dotted line in FIG. 2, a signal line 121a (first signal path or first signal line) and a ground plane 121b (first ground plane) are formed to the bottom face (one surface) of the relay substrate (substrate member) 120. The ground plane 121b is a ground plane of the signal line 121a. Further, the ground plane 121b is formed with a U-shape surrounding the signal line 121a.

A signal line 123a (second signal path or second signal line), a ground plane 123b, and a ground plane 123c (second ground plane) are arranged to the surface (opposed side of the bottom face) of the relay substrate 120. The signal line 123a, the ground plane 123b, and the ground plane 123c may form a coplanar line. The ground plane 123b and the ground plane 123c on the surface of the relay substrate 120 are connected to the ground plane 121b of the bottom face of the relay substrate 120 via a via-hole 124b.

Further, the relay substrate 120 comprises: a signal lead terminal (S: Signal) 122a and ground lead terminals (G: Ground) 122b to 122f. The signal lead terminal 122a, the ground lead terminal 122b, and the ground lead terminal 122c are arranged to one side of the bottom face of the relay substrate 120. The ground lead terminal 122b and the ground lead terminal 122c are arranged, sandwiching the signal lead terminal 122a.

The ground lead terminals 122d to 122f are arranged to the opposing side of the one side onto which the signal lead terminal 122a on the bottom face of the relay substrate 120 is arranged. The signal lead terminal 122a is connected to the signal line 121a on the bottom face of the relay substrate 120 by soldering. The ground lead terminals 122b to 122f are connected to the ground plane 121b on the bottom face of the relay substrate 120 by soldering.

Herein, the signal line 123a on the surface of the relay substrate 120 has a width W1 at a portion without forming the ground plane 121b on the bottom face of the relay substrate 120. Further, the signal line 123a on the surface of the relay substrate 120 has a width W2 at a portion with forming the ground plane 121b on the bottom face of the relay substrate 120. The width W2 is narrower than the width W1 so as to obtain same dielectric constant.

Figure 3:
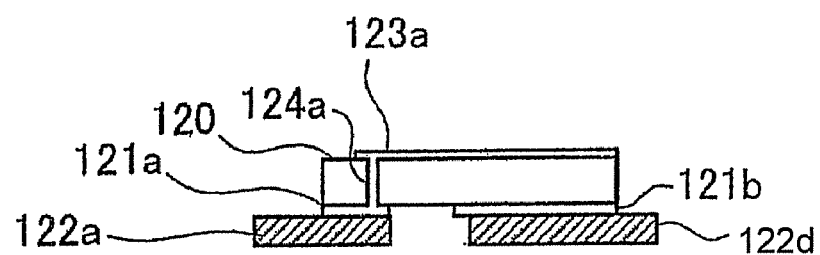
FIG. 3 is a cross-sectional view of an A-A line in FIG. 2.

FIG. 3 is a cross-sectional view of an A-A line in FIG. 2. Referring to FIG. 3, the signal line 121a on the bottom face of the relay substrate 120 is connected to the signal line 123a on the surface of the relay substrate 120 through a via-hole 124a (third signal path or third signal line) pierced in the thickness direction of the relay substrate 120. Further, the signal line 121a is formed with a short distance from the signal lead terminal 122a to the via-hole 124a.

As mentioned above, the signal line comprising the signal line 121a, the via-hole 124a, and the signal line 123a is leaded out from the bottom face of the relay substrate 120 to another surface. An end of the relay substrate 120 on the bottom face thereof of the signal line 121a has a predetermined area to become an electrode (first electrode) connected to the signal lead terminal 122a. Further, an end of the relay substrate 120 on the surface thereof of the signal line 121a has a predetermined area to become an electrode (second electrode) connected to the flexible printed circuit 130.

Herein, the description is given of the case in which the signal line 123a, the ground plane 123b, and the ground plane 123c on the surface of the relay substrate 120 are connected to the signal line 121a and the ground plane 121b on the bottom face via the via-hole 124a and the via-hole 124b, respectively. However, the signal line 123a, the ground plane 123b and the ground plane 123c on the surface of the relay substrate 120 may be connected to the signal line 121a and the ground plane 121b on the bottom face thereof via the side surface of the relay substrate 120 (similarly in the following) instead of the via-hole 124a and 124b.

Figure 4:
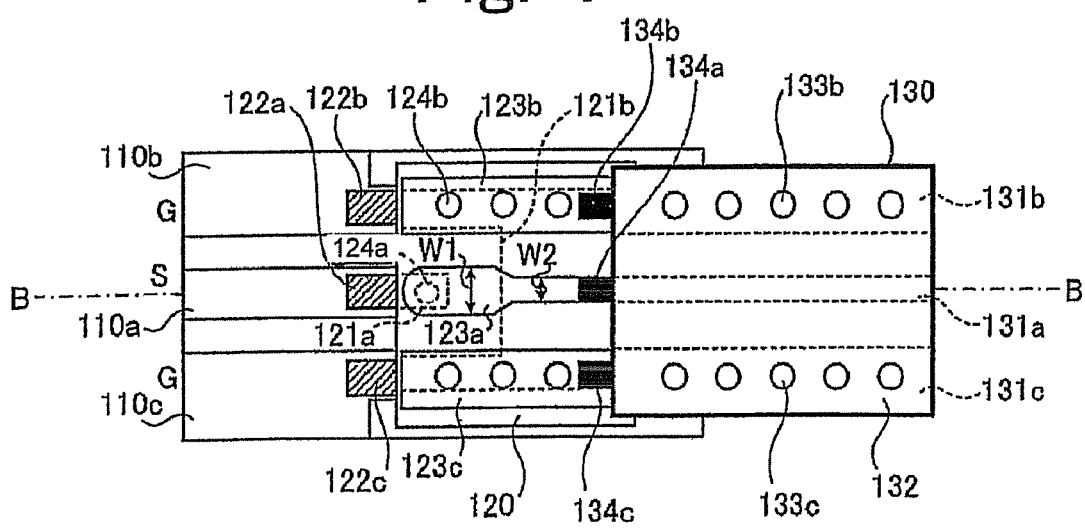
FIG. 4 is a plan view showing a printed circuit board using the relay substrate according to the embodiment.

FIG. 4 is a plan view showing the printed circuit board using the relay substrate according to the embodiment. Referring to FIG. 4, the same structure as that shown in FIG. 2 is designated by the same reference numeral and a description thereof is omitted. As shown in FIG. 4, a signal line 110a is formed onto the surface of the printed circuit board 110. Further, a ground line 110b and a ground line 110c are formed onto the surface of the printed circuit board 110, sandwiching the signal line 110a.

The signal line 110a, the ground line 110b, and the ground line 110c form a coplanar line. The signal line 121a on the bottom face of the relay substrate 120 is connected to the signal line 110a on the printed circuit board 110 via the signal lead terminal 122a. The signal lead terminal 122a is connected to the signal line 110a on the printed circuit board 110 by soldering.

The ground plane 121b on the bottom face of the relay substrate 120 is connected to the ground line 110b and the ground line 110c on the printed circuit board 110 via the ground lead terminal 122b and the ground lead terminal 122c. The ground lead terminal 122b and the ground lead terminal 122c are connected to the ground line 110b and the ground line 110c on the printed circuit board 110 by soldering.

As shown by a dotted line, a signal line 131a is formed onto the bottom face of the flexible printed circuit 130. Further, the bottom face of the flexible printed circuit 130 has a ground line 131b and a ground line 131c, sandwiching the signal line 131a. The signal line 131a, the ground line 131b, and the ground line 131c form a coplanar line. Further, the signal line 131a, the ground line 131b, the ground line 131c and a ground line 132 formed a microstrip line.

The ground line 132 is formed onto the entire surface of the flexible printed circuit 130. The ground line 132 on the surface of the flexible printed circuit 130 is connected to the ground line 131b on the bottom face of the flexible printed circuit 130 via a via-hole 133b. Further, the ground line 132 is connected to the ground line 131c on the bottom face of the flexible printed circuit 130 via a via-hole 133c.

A signal electrode 134a on the flexible printed circuit 130 is leaded out from the signal line 131a on the flexible printed circuit 130. A ground electrode 134b on the flexible printed circuit 130 is leaded out from the ground line 131b on the flexible printed circuit 130. A ground electrode 134c on the flexible printed circuit 130 is leaded out from the ground line 131c on the flexible printed circuit 130.

The signal electrode 134a on the flexible printed circuit 130 is connected to the signal line 123a on the relay substrate 120. The ground electrode 134b on the flexible printed circuit 130 is connected to the ground plane 123b on the relay substrate 120. The ground electrode 134c on the flexible printed circuit 130 is connected to the ground plane 123c on the relay substrate 120. The signal electrode 134a, the ground electrode 134b, and the ground electrode 134c are connected to the signal line 123a, the ground plane 123b and the ground plane 123c by soldering, respectively.

Herein, the signal line 110a on the printed circuit board 110 is sandwiched by the ground line 110b and the ground line 110c so as to prevent the interference with another electrode. However, the embodiment is not limited to this structure. For example, if the interval between the signal line 110a and another electrode is wide, the ground line 110b and the ground line 110c may not be provided. In this case, the ground plane 121b of the relay substrate 120 may be connected to the ground line 110b on the printed circuit board 110.

Further, herein, the description is given of the case in which the relay substrate 120 is connected to the printed circuit board 110 via the signal lead terminal 122a and the ground lead terminal 122b. However, according to the embodiment, the signal lead terminal 122a and the ground lead terminal 122b may be omitted. For example, by controlling the amount of soldering at the connection portion between the relay substrate 120 and the printed circuit board 110 to be a constant value, even if omitting the signal lead terminal 122a and the ground lead terminal 122b, preferable characteristics can be obtained.

Figure 5:
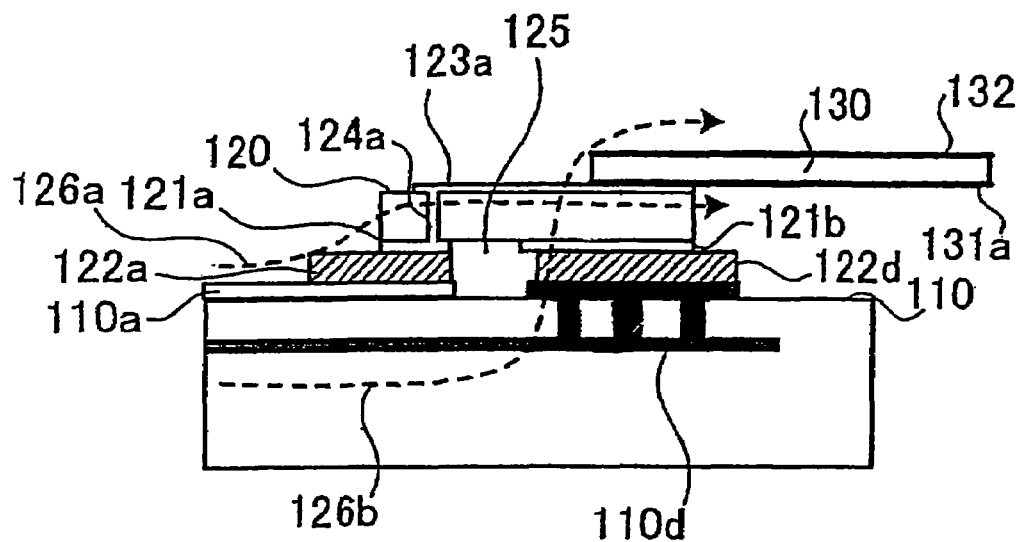
FIG. 5 is a cross-sectional view (No. 1) of a B-B line in FIG. 4.

FIG. 5 is a first cross-sectional view of a B-B line in FIG. 4. Referring to FIG. 5, the same structure as that shown in FIG. 3 is designated by the same reference numeral and a description thereof is omitted. Referring to FIG. 5, a ground line 110d is wired as an inner layer in the printed circuit board 110. The ground line 110d wired as the inner layer is leaded out to the surface of the printed circuit board 110. The ground lead terminal 122b on the bottom face of the relay substrate 120 is connected to a portion of the ground line 110d, leading out to the surface of the printed circuit board 110 by soldering.

Herein, the signal lead terminal 122a and the ground lead terminal 122b have a constant thickness, and are arranged with a certain distance. Therefore, the signal lead terminal 122a, the ground lead terminal 122b, the relay substrate 120, and the printed circuit board 110 form a space 125. The dielectric constant of the space 125 is 1.

Reference numeral 126a schematically shows a signal connection path. The signal line 110a on the printed circuit board 110 is connected to the signal line 131a on the flexible printed circuit 130 via the signal lead terminal 122a, the signal line 121a, the via-hole 124a, and the signal line 123a. Accordingly, the flexible printed circuit 130 is connected to the signal line 110a on the printed circuit board 110 with a certain distance to the printed circuit board 110.

Reference numeral 126b schematically shows a connection path of the ground plane. The ground line 110d in the printed circuit board 110 is connected to the ground line 132 on the flexible printed circuit 130 via the ground lead terminal 122d, the ground plane 121b, the via-hole 124b, the ground plane 123b, and the ground plane 123c. As a consequence, the connection path 126a of the signal line keeps the microstrip line to the connection path 126b of the ground plane, and the printed circuit board 110 is simultaneously connected to the flexible printed circuit 130.

Figure 6:
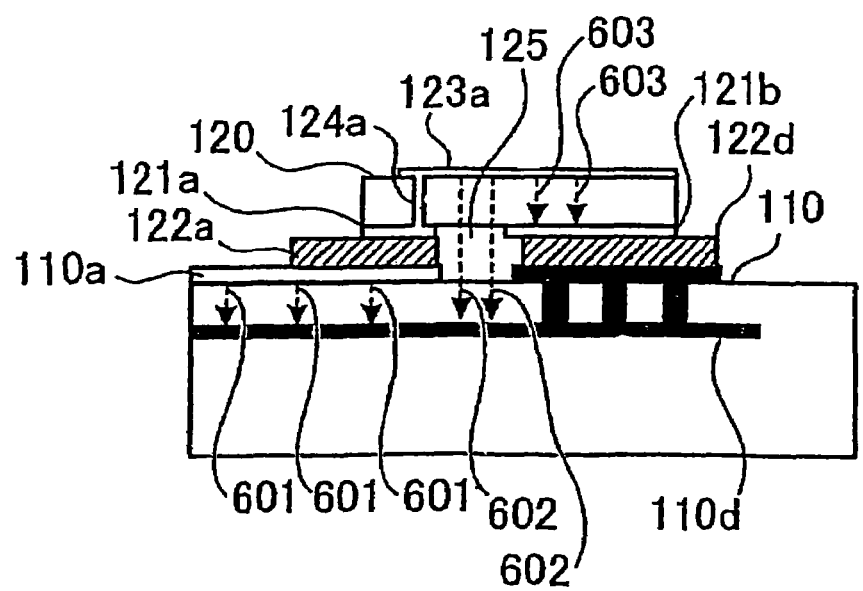
FIG. 6 is a cross-sectional view (No. 2) of a B-B line shown in FIG. 4.

FIG. 6 is a second cross-sectional view of the B-B line shown in FIG. 4. Referring to FIG. 6, the same structure as that shown in FIG. 5 is designated by the same reference numeral, and a description thereof is omitted. As shown by reference numeral 601, the signal line 110a on the printed circuit board 110 forms a microstrip line, corresponding to the ground line 110d in the printed circuit board 110. Further, as shown by reference numeral 602, at a portion where the ground plane 121b is not formed onto the bottom face of the relay substrate 120, of the signal line 123a on the surface of the relay substrate 120, a microstrip line is formed, corresponding to the ground line 110d in the printed circuit board 110.

Further, as shown by reference numeral 603, the ground plane corresponding to a portion where the ground plane 121b is formed onto the bottom face of the relay substrate 120, of the signal line 123a on the surface of the relay substrate 120, is the ground plane 121b on the bottom face of the relay substrate 120. As mentioned above, the relay substrate 120 forms a microstrip line for ensuring the ground plane from the signal line 121a to the signal line 123a.

Impedance $Z0$ of the microstrip line is expressed by $1/Z0 \propto \sqrt{\epsilon} xw/h$ where $\epsilon$ is dielectric constant, w is a wiring width, and h is a substrate thickness. With this expression, when the impedance $Z0$ is constant, the wiring with w is in reverse proportional to the substrate thickness h. Further, as $\epsilon$ is smaller, an error of the impedance due to the deviation between the wiring width w and the substrate thickness h is smaller.

Based on this, the signal line 121a and the signal line 123a have widths corresponding to the distance to the corresponding ground plane s. Herein, the width of the signal line 110a on the printed circuit board 110 keeps impedance characteristic to 50Ω to the ground line 110d in the printed circuit board 110.

Further, the width W1 (refer to FIG. 2) of the portion where the ground plane 121b is not formed on the bottom face of the relay substrate 120, of the signal line 123a on the surface of the relay substrate 120 keeps impedance characteristic to 50Ω to the ground line 110d in the printed circuit board 110. Further, the width W2 of the portion where the ground plane 121b is formed on the bottom face of the relay substrate 120, of the signal line 123a on the surface of the relay substrate 120 keeps impedance characteristic to 50Ω to the ground plane 121b on the bottom face of the relay substrate 120.

The distance between the signal line 123a and the ground line 110b, shown by reference numeral 602, is longer than the distance between the signal line 123a and the ground plane 121b, shown by reference numeral 603. Therefore, in order to set, to be constantly 50Ω, the impedance characteristic of the microstrip line from the signal line 110a on the printed circuit board 110 to the signal line 123a on the surface of the relay substrate 120, the width W2 of the signal line 123a on the surface of the relay substrate 120, shown by reference numeral 603, is narrower than the width W1 shown by reference numeral 602 (refer to FIG. 2). In this case, the width of the signal line 123a may continuously change. As a consequence, preferable transfer characteristics can be obtained.

With this structure, the flexible printed circuit 130 keeps the impedance characteristic and is also connected to the signal line 110a on the printed circuit board 110. Further, the flexible printed circuit 130 has the distance to the printed circuit board 110 in the height direction and is connected to the signal line 110a on the printed circuit board 110. Therefore, the flexible printed circuit 130 can keep the impedance characteristic without the influence due to the printed circuit board 110, thereby improving the transfer characteristics.

Further, the relay substrate 120 is a ceramic substrate that can be processed up to the end of the substrate and ensures the positional precision of the electrode. Therefore, the flexible printed circuit 130 can be connected just to the end of the relay substrate 120. Accordingly, the flexible printed circuit 130 can keep the impedance characteristic without the influence due to the printed circuit board 110, thereby improving the transfer characteristics.

Further, according to the embodiment, the width W2 is narrower than the width W1, thereby setting, to be constant (herein, 50Ω), the impedance characteristic of the microstrip line from the signal line 110a on the printed circuit board 110 to the signal line 123a on the relay substrate 120. Furthermore, the impedance characteristic is ensured without changing the type of paths, thereby obtaining fast data transfer characteristics (e.g., 50 GHz) in the connection of a high-frequency signal.

In addition, the structure according to the embodiment uses, for the relay substrate 120, a material having the dielectric constant higher than that of the printed circuit board 110, and the influence to the flexible printed circuit 130 due to the printed circuit board 110 is thus reduced to keep the impedance characteristic, thereby improving the transfer characteristics. In addition, the outer shape of the relay substrate 120 is the same as that of a usual IC package, thereby automatically mounting the relay substrate 120 on the printed circuit board 110.

In addition, with the structure according to the embodiment, when the relay substrate 120 contains ceramic, the shape of the relay substrate 120 can be freely selected, thereby improving the precision of the size of the electrode arranged to the relay substrate 120. Further, with the structure according to the embodiment, the position as well as the shape of the electrode arranged to the relay substrate 120 can be freely selected, thereby reducing the size of the module including the printed circuit board 110 and the relay substrate 120.

In addition, if the line of the microstrip line is coated with the soldering, the impedance characteristic does not change. Therefore, an error of the impedance characteristic due to the amount of soldering is small. Accordingly, the structure according to the embodiment can obtain stable impedance characteristic. With the structure according to the embodiment, the relay substrate 120 is connected to the printed circuit board 110 via the signal lead terminal 122a and the ground, lead terminal 122b with the thickness, thereby improving the strength of the connection portion.

In addition, with structure according to the embodiment, the relay substrate 120 is connected to the printed circuit board 110 via the signal lead terminal 122a and the ground lead terminal 122b with the thickness. As a consequence, if the relay substrate 120 and the flexible printed circuit 130 are detached from the printed circuit board 110, the damage is small. Therefore, with the structure according to the embodiment, the detached relay substrate 120 and flexible printed circuit 130 can be reconnected to the printed circuit board 110 or another multi-layered substrate.

In addition, with the structure according to the embodiment, the relay substrate 120 is connected to the printed circuit board 110 via the signal lead terminal 122a and the ground lead terminal 122b, thereby forming the space 125. The dielectric constant of the space 125 is 1, and is greatly smaller than the dielectric constant of the relay substrate 120 and the printed circuit board 110 containing ceramic. Therefore, with the structure according to the embodiment, if deviating the position of the relay substrate 120 from the position of the printed circuit board 110 in the soldering, the impedance characteristic can be kept.

Figure 7:
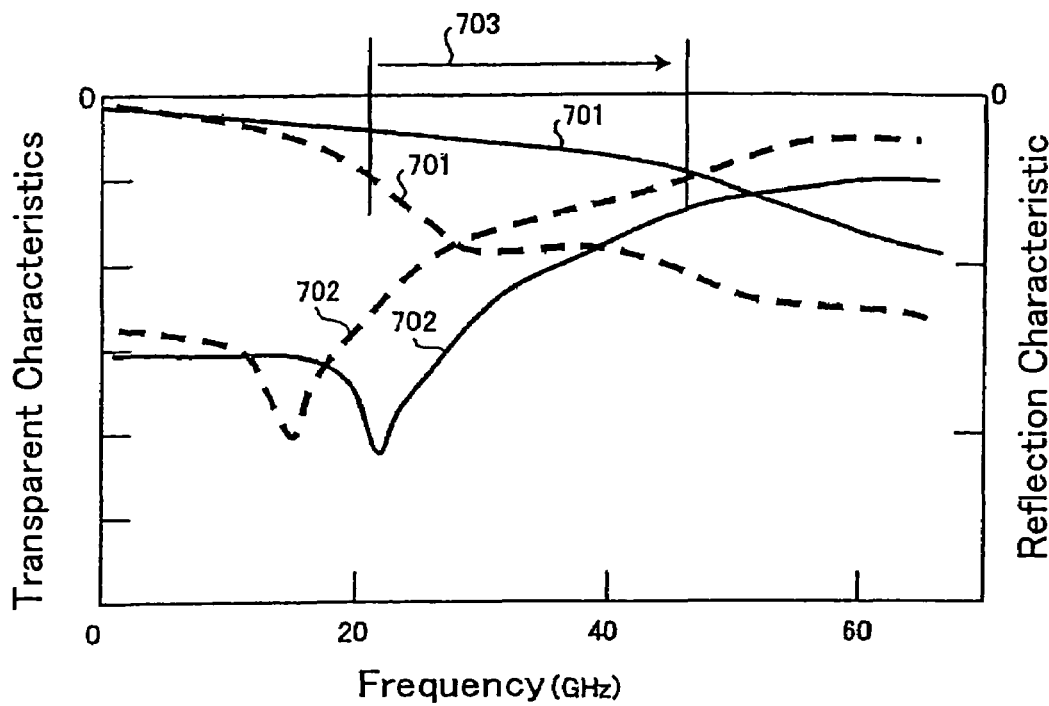
FIG. 7 is a characteristic diagram showing characteristics of the printed circuit board using the relay substrate according to the embodiment.

FIG. 7 is a characteristic diagram showing characteristics of the printed circuit board using the relay substrate according to the embodiment. Referring to FIG. 7, the horizontal axis denotes a frequency (GHz) of a signal input/output to/from the printed circuit board 110. Reference numeral 701 denotes transmission characteristics of the signal input/output to/from the printed circuit board 110. Reference numeral 702 denotes reflection characteristics of the signal input/output to/from the printed circuit board 110.

A dotted line denotes characteristics of a conventional printed circuit board. A solid line denotes characteristics of the printed circuit board 110 using the relay substrate 120 according to the embodiment. Referring to FIG. 7, the printed circuit board 110 using the relay substrate 120 according to the embodiment has transmission characteristics higher than those of the conventional one, and also has reflection characteristics lower than that. That is, according to the embodiment, the printed circuit board 110 has transmission characteristics and the reflection characteristics, improved as compared with those of the conventional printed circuit board.

Reference numeral 703 denotes the amount of improvement band of the printed circuit board 110 using the relay substrate 120 according to the embodiment with comparison with that of the conventional printed circuit board. As shown by reference numeral 703, the band of the printed circuit board 110 using the relay substrate 120 according to the embodiment is improved by approximately 2.5 times of the band of the conventional printed circuit board.

Figure 8:
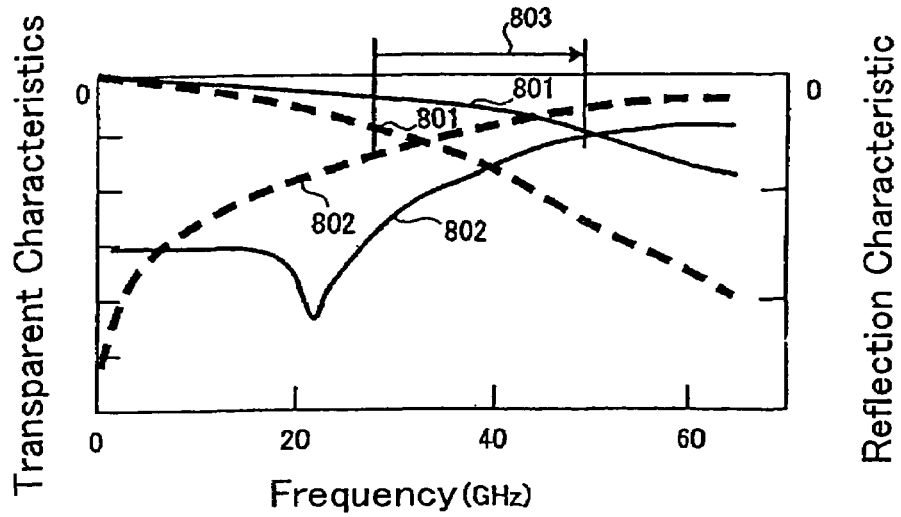
FIG. 8 is a characteristic diagram showing a relationship between the width of a wiring and characteristics of the printed circuit board using the relay substrate according to the embodiment.

FIG. 8 is a characteristic diagram showing the width of a wiring and characteristics of the printed circuit board using the relay substrate according to the embodiment. Referring to FIG. 8, the horizontal axis denotes a frequency (GHz) of a frequency of the signal input/output to/from the printed circuit board 110. Reference numeral 801 denotes transmission characteristics of the signal input/output to/from the printed circuit board 110. Reference numeral 802 denotes reflection characteristics of the signal input/output to/from the printed circuit board 110.

A dotted line denotes characteristics of the printed circuit board 110 when the signal line 123a on the surface of the relay substrate 120 is constant (W1=W2). A solid line denotes characteristics of the printed circuit board 110 when changing the width of the signal line 123a on the surface of the relay substrate 120 (W1>W2, refer to FIG. 2). Referring to FIG. 8, if changing the width of the signal line 123a on the surface of the relay substrate 120, the printed circuit board 110 has higher transmission characteristics and lower reflection characteristics, as compared with the printed circuit board 110 when setting, to be constant, the width of the signal line 123a on the surface of the relay substrate 120.

Reference numeral 803 denotes the amount of improvement band of the printed circuit board 110 upon changing the width of the signal line 123a on the surface of the relay substrate 120, in comparison with the printed circuit board 110 upon setting, to be constant, the width of the signal line 123a on the surface of the relay substrate 120. As shown by reference numeral 803, with respect to the printed circuit board 110 upon changing the width of the signal line 123a on the surface of the relay substrate 120, the band thereof is improved by approximately 70% as compared with the band of the printed circuit board 110 upon setting, to be constant, the width of the signal line 123a on the surface of the relay substrate 120.

Figure 9:
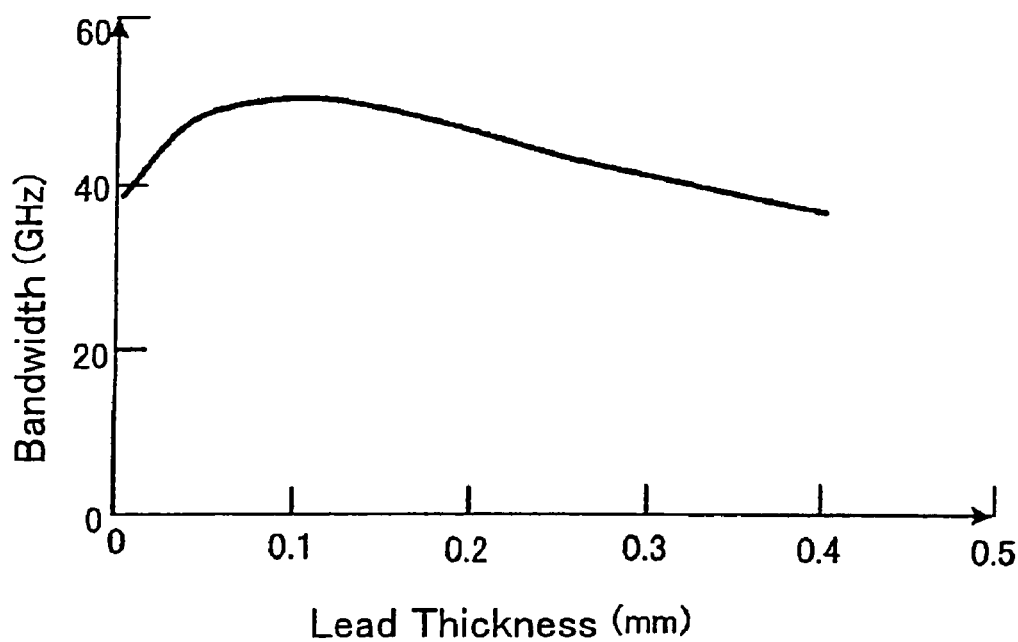
FIG. 9 is a characteristic diagram showing a relationship between the thickness of a lead terminal and a band of a printed circuit board using the relay substrate according to the embodiment.

FIG. 9 is a characteristic diagram showing a relationship between the band of the printed circuit board using the relay substrate according to the embodiment and the thickness of the lead terminal. Referring to FIG. 9, the horizontal axis denotes the thickness (mm) of the signal lead terminal 122a and the ground lead terminal 122b. The ordinate denotes the band (GHz) of the printed circuit board 110.

As shown in FIG. 9, within a wide range of the thickness of the signal lead terminal 122a and the ground lead terminals 122b to 122f, a stable band can be obtained. In particular, the thickness of the signal lead terminal 122a and the ground lead terminal 122b to 122f is 0.05 mm to 0.25 mm. Thus, if changing the amount of soldering, preferable characteristics can be stably obtained.

Figure 10:
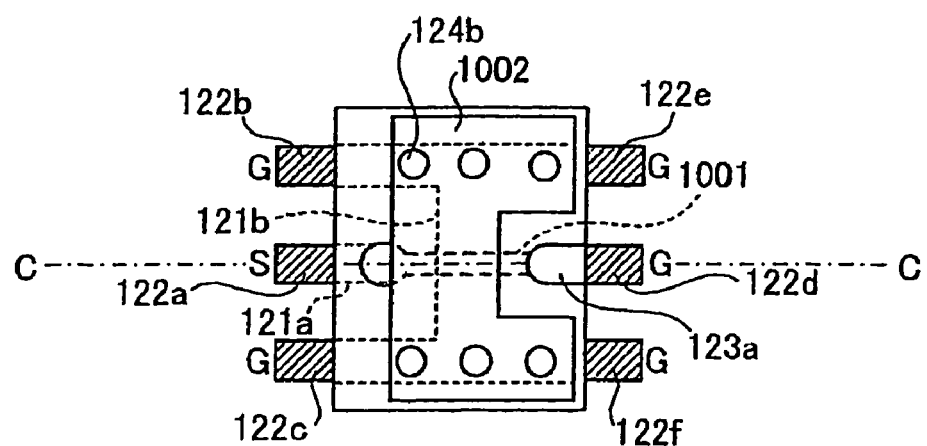
FIG. 10 is a plan view showing a relay substrate according to the first modification of the relay substrate of the embodiment.

FIG. 10 is a plan view showing of a relay substrate according to a first modification of the embodiment. Referring to FIG. 10, the same reference numeral denotes the same structure as shown in FIG. 2, and a description thereof is omitted. As shown by a dotted line in FIG. 10, a relay substrate 120 according to the first modification of the embodiment has a strip line structure through which a signal line 1001 (fourth signal path or fourth signal line) passes.

Further, a ground plane 1002 formed onto the surface of the relay substrate 120 is formed with a U-shape surrounding the signal line 123a. Therefore, the signal line 1001 passing through the relay substrate 120 is sandwiched by the ground plane 121b on the bottom face of the relay substrate 120 and the ground plane 1002 on the surface thereof. This structure enables the connection using the relay substrate 120 with larger thickness, and can correspond to a situation in which the thickness of the relay substrate 120 is required.

Figure 11:
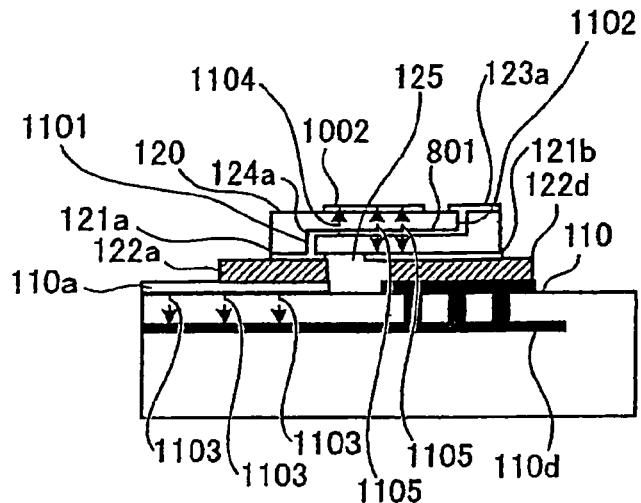
FIG. 11 is a cross-sectional view of a cross-section of a C-C line in FIG. 10 and the printed circuit board.

FIG. 11 is a cross-sectional view showing a cross-section of a C-C line shown in FIG. 10 and the printed circuit board. Referring to FIG. 11, the same reference numeral as that shown in FIG. 5 denotes the same structure and a description thereof is omitted. Referring to FIG. 11, the signal line 121a on the bottom face of the relay substrate 120 is connected to one end of the signal line passing through the relay substrate 120 via a via-hole 1101.

The other end of the signal line 1001 passing through the relay substrate 120 is connected to the signal line 123a on the surface of the relay substrate 120 via a via-hole 1102. As shown by reference numeral 1103, the signal line 110a on the printed circuit board 110 forms a microstrip line, corresponding to the ground line 110d in the printed circuit board 110.

Further, as shown by reference numeral 1104, at a portion where the ground plane 121b is not formed on the bottom face of the relay substrate 120, of the signal line 1001 passing through the relay substrate 120, a microstrip line is formed corresponding to the ground plane 1002 on the surface of the relay substrate 120. Further, as shown by reference numeral 1105, at a portion where the ground plane 121b is formed on the bottom face of the relay substrate 120, of the signal line 1001 passing through the relay substrate 120, a microstrip line is formed corresponding to the ground plane 1002 on the surface of the relay substrate 120 and the ground plane 121b on the bottom face of the relay substrate 120.

The signal line 1001 has a width corresponding to the distance to the corresponding ground plane. Herein, the width of the signal line 110a on the printed circuit board 110 keeps the impedance characteristic to 50Ω at the interval to the ground line 110d in the printed circuit board 110. Further, the width W1 at the portion where the ground plane 121b is not formed on the bottom face of the relay substrate 120, of the signal line 1001 passing through the relay substrate 120, the impedance characteristic is kept to 50Ω at an interval to the ground plane 1002 on the surface of the relay substrate 120.

Further, the width W2 at the portion where the ground plane 121b is formed on the bottom face of the relay substrate 1201, of the signal line 1001 passing through the relay substrate 120, the impedance characteristic is kept to 50Ω between the ground plane 1002 on the surface of the relay substrate 120 and the ground plane 121b on the bottom face of the relay substrate 120. Incidentally, the ground plane 1002 formed on the surface of the relay substrate 120 is not formed at the portion where the via-hole 1101 passes through the relay substrate 120, thereby stably keeping the impedance characteristic.

With this structure, the flexible printed circuit 130 also keeps the impedance characteristic and is simultaneously connected to the signal line 110a on the printed circuit board 110. Further, the flexible printed circuit 130 has the distance to the printed circuit board 110 in the height direction and is connected to the signal line 110a on the printed circuit board 110. Therefore, the flexible printed circuit 130 can keep the impedance characteristic without the influence from the printed circuit board 110, thereby improving the transfer characteristics.

Further, the relay substrate 120 is a ceramic substrate that can be processed up to the end of the substrate and ensures the positional precision of the electrode. Therefore, the flexible printed circuit 130 can be connected just to the end of the relay substrate 120. As a consequence, the flexible printed circuit 130 can keep the impedance characteristic without the influence from the printed circuit board 110, thereby improving the transfer characteristics.

Figure 12:
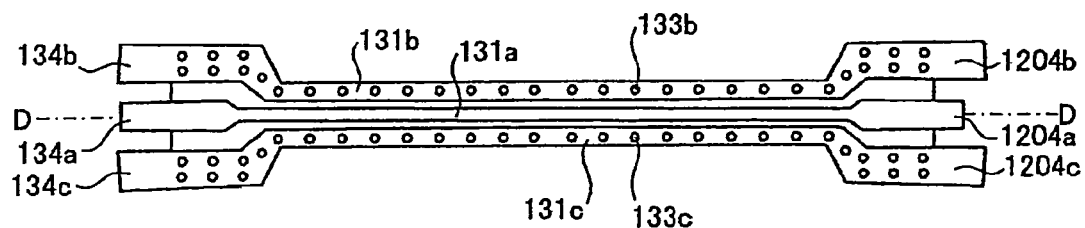
FIG. 12 is a plan view showing an example of a surface on which a signal line is formed on a flexible printed circuit.

FIG. 12 is a plan view showing one example of a surface on which the signal line of the printed circuit board is formed. Referring to FIG. 12, on the surface on which the signal line 131 on the flexible printed circuit 130a is formed, the ground line 131b and the ground line 131c are formed, sandwiching the signal line 131a. The ground line 131b is connected to the ground line 132 formed on the opposite surface via the via-hole 133b. The ground line 131c is connected to the ground line 132 formed on the opposite surface via the via-hole 133c.

Herein, a signal electrode 1204a denotes an electrode at the end of the signal line 131a on the opposite side of the signal electrode 134a. Further, a ground electrode 1204b denotes an electrode at the end of the ground line 131b on the opposite side of the ground electrode 134b. Furthermore, a ground electrode 1204c denotes an electrode at the end of the ground line 131c on the opposite side of the ground electrode 134c.

Figure 13:
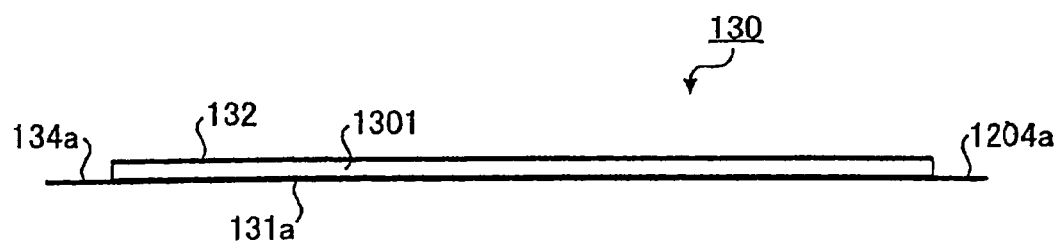
FIG. 13 is a cross-sectional view of a D-D line in FIG. 12.

FIG. 13 is a cross-sectional view of a D-D line shown in FIG. 12. Referring to FIG. 13, on the flexible printed circuit 130, a substrate portion 1301 is formed to be sandwiched by the surface on which the signal line 131a is formed and the ground line 132. The signal electrode 134a and the signal electrode 1204a of the signal line 131a are leaded out from the signal line 131a to be projected from the substrate portion 1301 and the ground line 132. The substrate portion 1301 is a substrate containing, such as polyimide, with flexibility. Further, liquid crystal polymer with higher characteristics may use for the substrate portion 1301.

Figure 14:
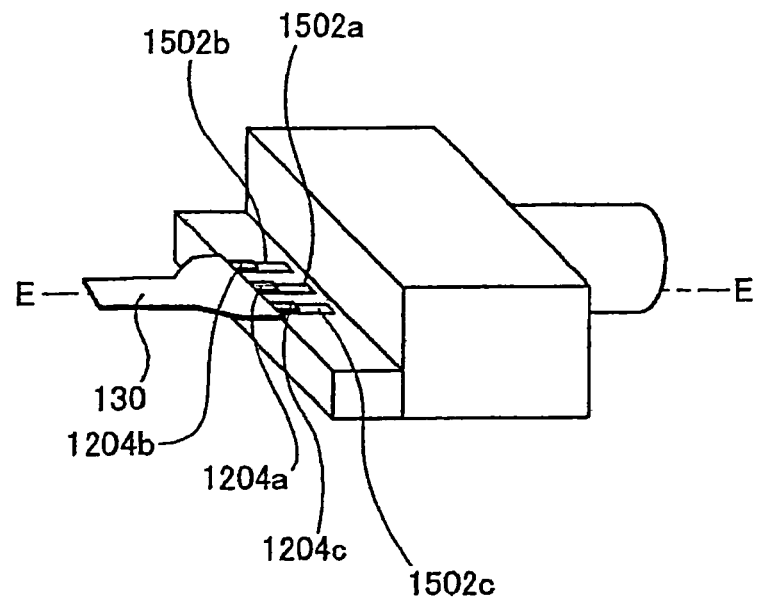
FIG. 14 is a perspective view showing the connection portion between a flexible printed circuit and an optical device.
Figure 15:
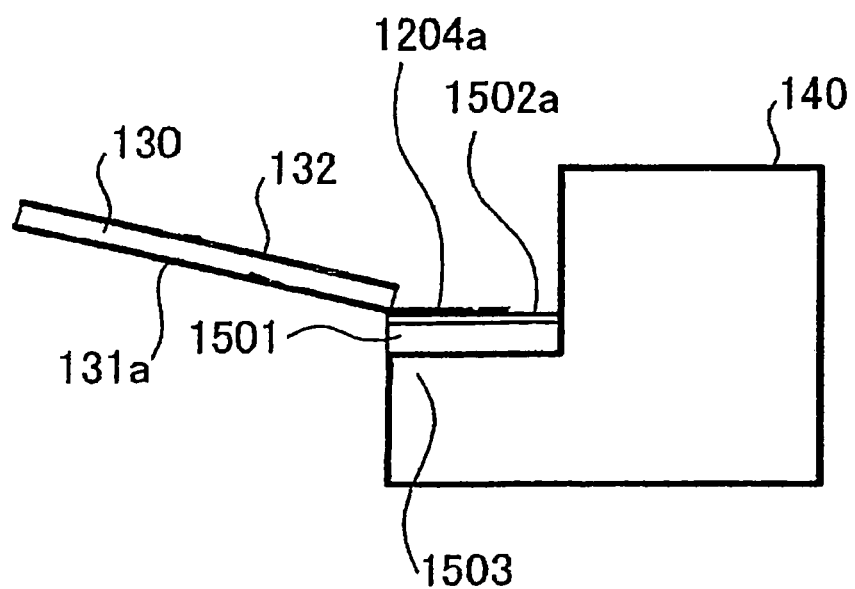
FIG. 15 is a cross-sectional view of an E-E line in FIG. 14.

FIG. 14 is a perspective view showing a connection portion between the flexible printed circuit and the optical device. FIG. 15 is a cross-sectional view of an E-E line shown in FIG. 14. Referring to FIGS. 14 and 15, the flexible printed circuit 130 is connected to the optical device 140 so that the surface where the signal line 131a is formed is on the side of the optical device 140. On the optical device 140, a signal line 1502a and a ground line 1503 are formed, sandwiching a ceramic substrate 1501.

The signal electrode 1204a of the signal line 131a on the flexible printed circuit 130 is connected to the signal line 1502a of the optical device 140 by soldering. Further, the ground electrode 1204b of the ground line 131b on the flexible printed circuit 130 is connected to a ground line 1502b of the optical device 140 by soldering. Furthermore, the ground electrode 1204c of the ground line 131c on the flexible printed circuit 130 is connected to a ground line 1502c of the optical device 140 by soldering.

Figure 16:
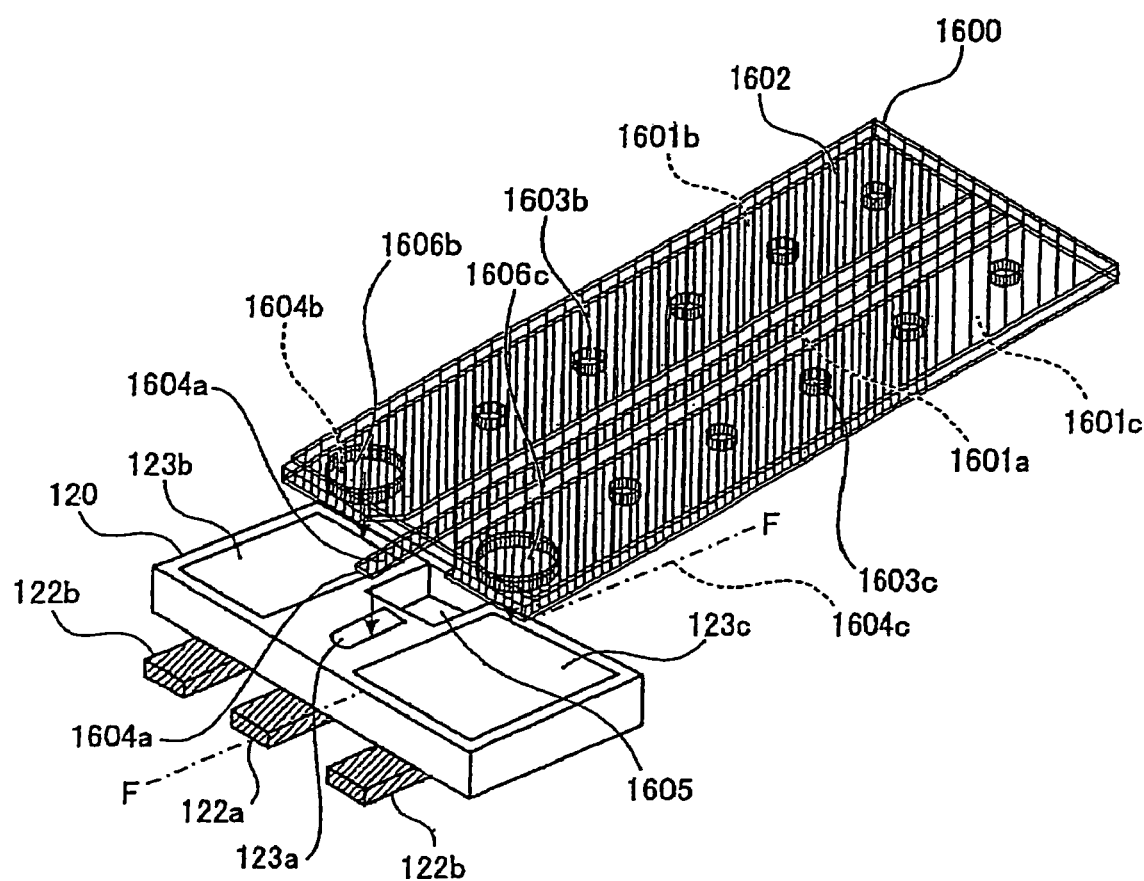
FIG. 16 is a perspective view showing a relay substrate according to the second modification of the embodiment.
Figure 17:
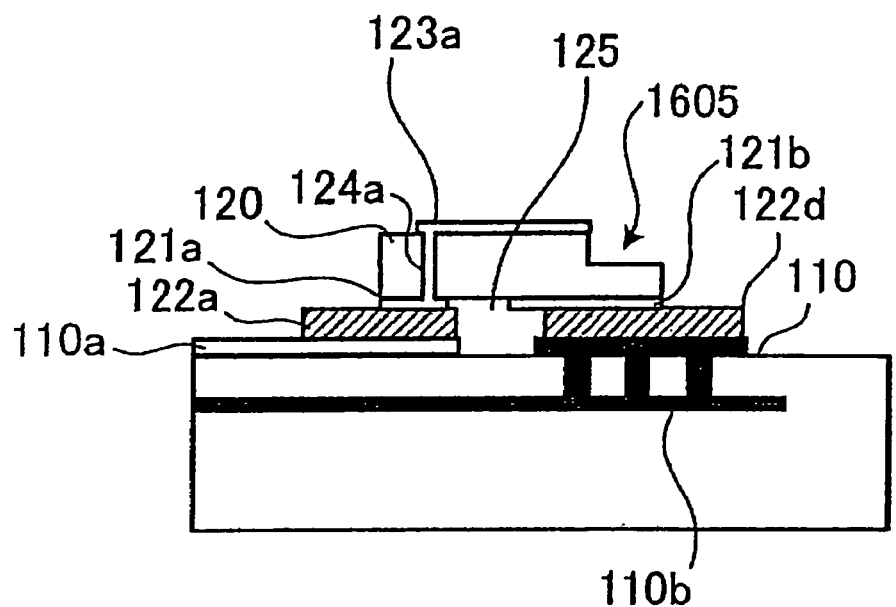
FIG. 17 is a cross-sectional view of an F-F line in FIG. 16.

FIG. 16 is a perspective view showing a relay substrate according to the second modification of the embodiment. FIG. 17 is a cross-sectional view of an F-F line shown in FIG. 16. As shown in FIG. 16, a signal line 1601a is formed on the bottom face of a flexible printed circuit 1600 connected to the relay substrate 120 according to the second modification. Further, on the bottom face of the flexible printed circuit 1600, a ground line 1601b and a ground line 1601c are formed, sandwiching the signal line 1601a. The signal line 1601a, the ground line 1601b, and the ground line 1601c form a coplanar line.

The ground line 1602 is formed to one surface of the surface of the flexible printed circuit 1600. The ground line 1602 on the surface of the flexible printed circuit 1600 is connected to the ground line 1601b on the bottom face of the flexible printed circuit 1600 via a via-hole 1603b. Further, the ground line 1602 is connected to the ground line 1601c on the bottom face of the flexible printed circuit 1600 via a via-hole 1603c. The signal line 1601a, the ground line 1601b, the ground line 1601c, and the ground line 1602 form a microstrip line.

The signal electrode 1604a on the flexible printed circuit 1600 is leaded out from the signal line 1601a on the flexible printed circuit 1600. Further, the signal electrode 1604a is leaded out to be projected from the end of the flexible printed circuit 1600. The signal electrode 1604a is connected to the signal line 123a on the relay substrate 120 by soldering.

As shown in FIGS. 16 and 17, the relay substrate 120 according to the second modification of the embodiment has a hollow portion 1605 (predetermined hollow portion) near the signal line 131a on the flexible printed circuit 1600. Further, the ground plane 123b and the ground plane 123c formed on the surface of the relay substrate 120 are formed with a wide area. For example, the ground plane 123b and the ground plane 123c are formed with an area sufficiently wider than the area of the signal line 123a.

At the end on the side where a signal electrode 1604a is leaded out of the surface on which where the ground line 1602 on the flexible printed circuit 1600 is formed, a hole 1606b from which the ground line 1601b on the flexible printed circuit 1600 is exposed and a hole 1606c from which the ground line 1601c on the bottom face of the flexible printed circuit 1600 is exposed are formed. A portion where the rear side of the ground line 1601b on the flexible printed circuit 1600 is exposed from the hole 1606b becomes a ground electrode 1604b connected to the ground plane 123b on the printed circuit board 110.

A portion where the rear side of the ground line 1601c on the flexible printed circuit 1600 is exposed from the hole 1606c becomes a ground electrode 1604c connected to the ground plane 123c on the relay substrate 120. The ground line 1601b and the ground line 1601c are fused and fixed to the ground plane 123b and the ground plane 123c by heating from the hole 1606b and the hole 1606c with laser beams.

With this structure according to the embodiment, the connection area between the ground line 1601b and the ground line 1601c and the ground plane 123b and the ground plane 123c can be increased. With this structure according to the embodiment, it is possible to improve the connection intensity of the connection portion between the ground plane of the relay substrate 120 and the flexible printed circuit 1600.

Further, according to the embodiment, it is possible to reduce the stress to the connection portion between the signal line 123a on the relay substrate 120 and the signal electrode 1604a on the flexible printed circuit 1600 and to improve the durability of the connection path 126a (refer to FIG. 5) of the signal. Furthermore, according to the embodiment, the hollow portion 1605 is arranged near the signal line 131a on the flexible printed circuit 1600 on the relay substrate 120, thereby reducing the influence to the flexible printed circuit 1600 from the relay substrate 120. Thus, the impedance characteristic can be kept.

Incidentally, according to the embodiment, a fixing material may be used so as to individually fix the ground line 1601b and the ground line 1601c to the ground plane 123b and the ground plane 123c. Specifically, the fixing material is arranged between the ground line 1601b and the ground plane 123b and between the ground line 1601c and the ground plane 123c, respectively. The fixing material can contain gold (Au), stannum (Sn), or aluminum (Al).

For example, the ground plane 123b and the ground plane 123c on the relay substrate 120 are plated with the fixing material in advance. Thereafter, the ground line 1601b and the ground line 1601c on the flexible printed circuit 1600 are arranged on the ground plane 123b and the ground plane 123c, respectively. The heating with laser beams from the hole 1606b and the hole 1606c fuses and fixes the ground electrode 1604b and the ground electrode 1604c to the ground plane 123b and the ground plane 123c, respectively. Incidentally, the fixing material can be a soldering ball. Further, the fixing material can be used with solderless fixing as well as the fusing and fixing.

Figure 18:
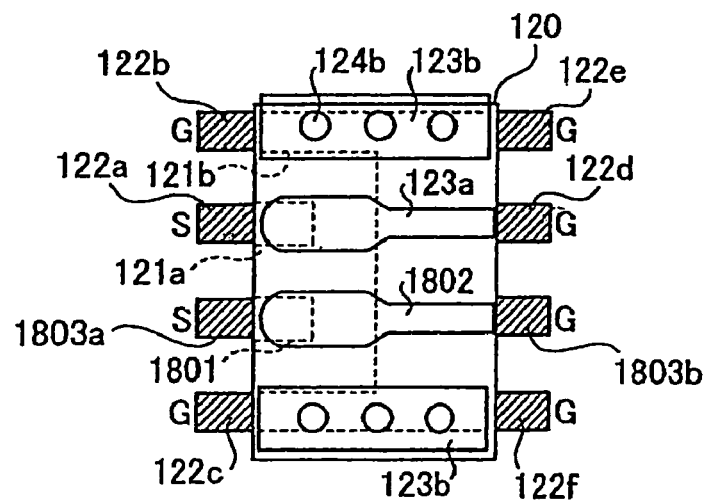
FIG. 18 is a plan view showing a relay substrate according to the third modification of the embodiment.

FIG. 18 is a plan view showing a relay substrate according to the third modification of the embodiment. Referring to FIG. 18, the same structure as that shown in FIG. 2 is designated by the same reference numeral and a description thereof is omitted. According to the third modification of the embodiment, the relay substrate 120 comprises a plurality of signal lead terminals and signal electrodes. As shown in FIG. 18, the relay substrate 120 comprises a signal line 1801, a signal line 1802, a signal lead terminal 1803a, and a ground lead terminal 1803b in addition to the structure shown in FIG. 2.

The signal line 1801 is arranged between the signal line 121a and the ground plane 121b on the bottom face of the relay substrate 120. The signal line 1802 is arranged between the signal line 123a and the ground plane 123b on the surface of the relay substrate 120. The signal lead terminal 1803a is arranged between the signal lead terminal 122a and the ground lead terminal 122c. The ground lead terminal 1803b is arranged between the ground lead terminal 122d and the ground lead terminal 122f.

The signal line 1801 is connected to the signal lead terminal 1803a by soldering. Further, the signal line 1801 is connected to the signal lead terminal 1802 via a via-hole (not shown). The ground lead terminal 1803b is connected to a portion (refer to FIG. 5) leading out of the surface of the printed circuit board 110 of the ground line 110d. With this structure, even if there are a plurality of signal lines (e.g., signal lines for differential) between the printed circuit board 110 and the flexible printed circuit 130, the connection of the individual signal lines can be relayed on the relay substrate 120.

Figure 19:
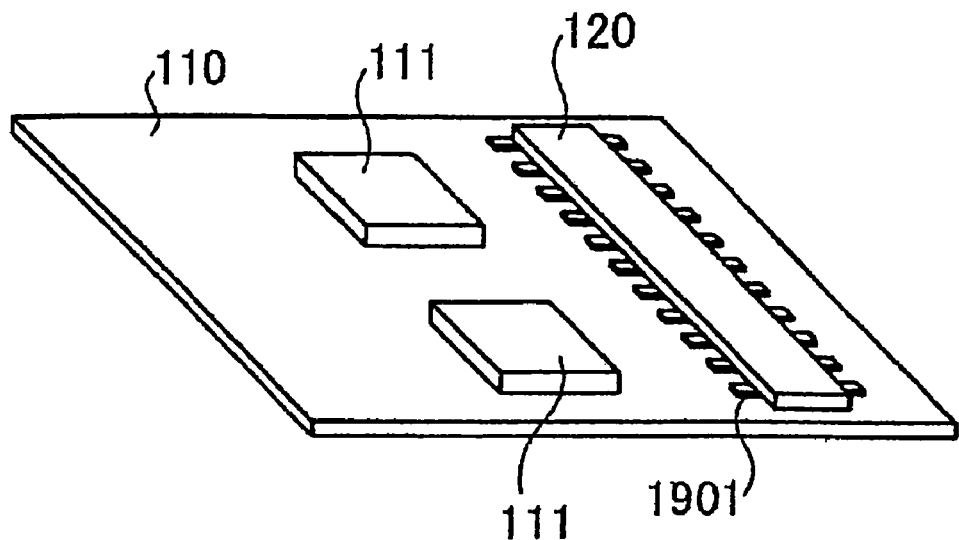
FIG. 19 is a perspective view showing a relay substrate according to the fourth modification of the embodiment.

FIG. 19 is a perspective view showing a relay substrate according to the fourth modification of the embodiment. Referring to FIG. 19, the same structure as that shown in FIG. 1 is designated by the same reference numeral and a description thereof is omitted. As shown in FIG. 19, the relay substrate 120 according to the fourth modification of the relay substrate 120 of the embodiment comprises a large number of (herein, 22) lead terminals 1901.

Further, the relay substrate 120 comprises a number of signal lines (similarly to the signal lines 121a) arranged on the bottom face of the relay substrate 120 and of signal lines (similarly to the signal lines 123a) arranged on the surface thereof, corresponding to the number of the lead terminals 1901. With this structure, even if the printed circuit board 110 and the flexible printed circuit 130 have a large number of signal lines (e.g., low-speed control cables), the relay substrate 120 can relay the connection of the signal lines.

Figure 20:
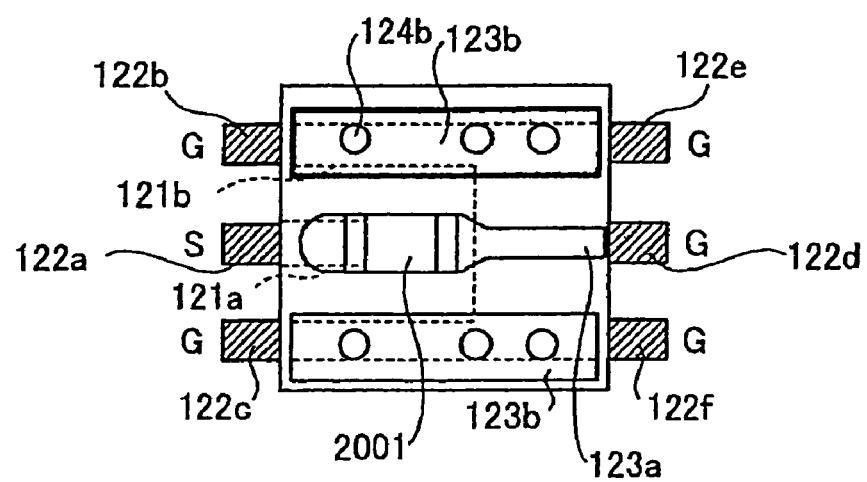
FIG. 20 is a plan view showing a relay substrate according to the fifth modification of the embodiment.

FIG. 20 is a plan view showing a relay substrate according to the fifth modification of the embodiment. Referring to FIG. 20, the relay substrate 120 according to the fifth modification of the embodiment includes an electronic part 2001 on the signal line 123a on the surface of the relay substrate 120. The arrangement of the electronic part 2001 on the relay substrate 120 containing ceramic enables the structure shown in FIG. 20 to obtain preferable impedance characteristic. Further, the electronic part 2001 may also be arranged on the flexible printed circuit 130.

Figure 21:
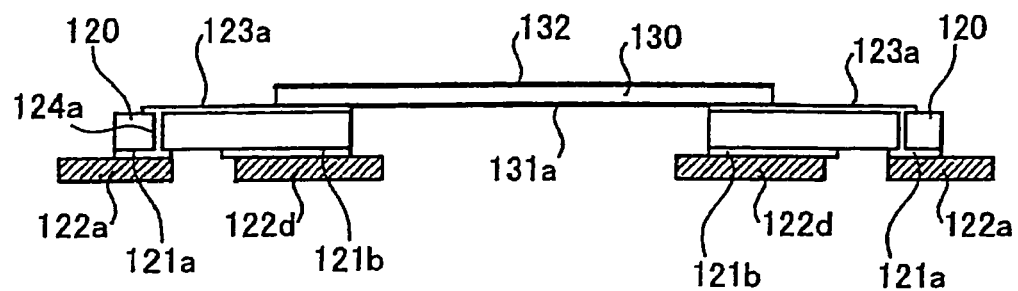
FIG. 21 is a longitudinal front view showing a flexible printed circuit on which a relay substrate is connected to both ends thereof according to the embodiment.

FIG. 21 is a longitudinal front view showing a flexible printed circuit on which a relay substrate is connected to both ends thereof according to the embodiment. Referring to FIG. 21, the relay substrate 120 according to the embodiment may be connected to both ends of the flexible printed circuit 130. With the structure shown in FIG. 21, the relay operation is possible in a state for improving characteristics between both the multi-layered substrates (printed circuit board 110 (not shown)) connected to the flexible printed circuit 130.

Figure 22:
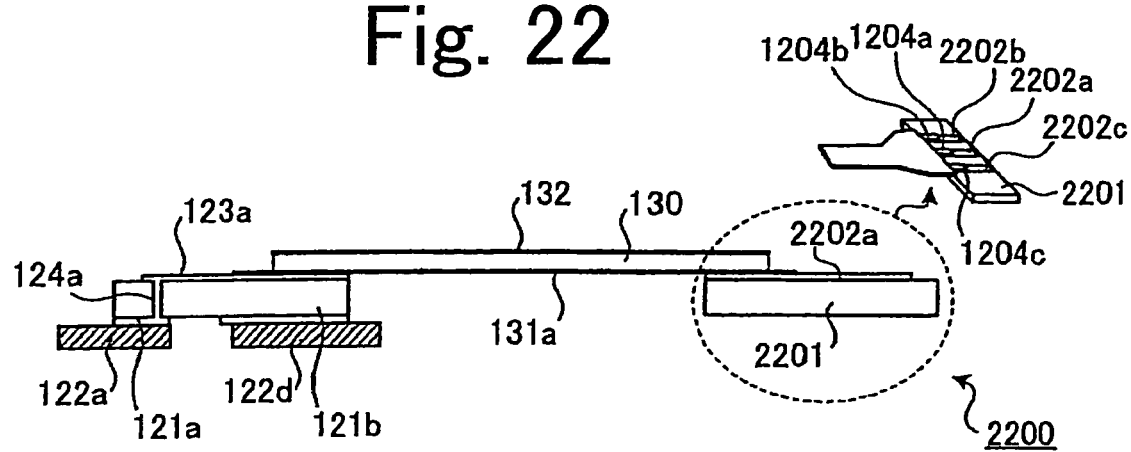
FIG. 22 is a longitudinal front view showing a flexible printed circuit on which a relay substrate and a multi-layered substrate are connected according to the embodiment.

FIG. 22 is a longitudinal front view showing a flexible printed circuit on which the relay substrate is connected to the multi-layered substrate according to the embodiment. Referring to FIG. 22, the other end of the flexible printed circuit 130 connected to the relay substrate 120 according to the embodiment is connected to a multi-layered substrate 2200. On the surface of the multi-layered substrate 2200, a signal line 2202a and a ground line 2202b and a ground line 2202c that sandwich the signal line 2202a are formed.

The signal line 2202a, the ground line 2202b, and the ground line 2202c form a coplanar line. As mentioned above, the relay substrate 120 according to the embodiment can be used for the relay operation in the case of connecting a circuit-mounted substrate to other multi-layered substrates as well as in the case of connecting the printed circuit board 110 to the optical device 140.

Figure 23:
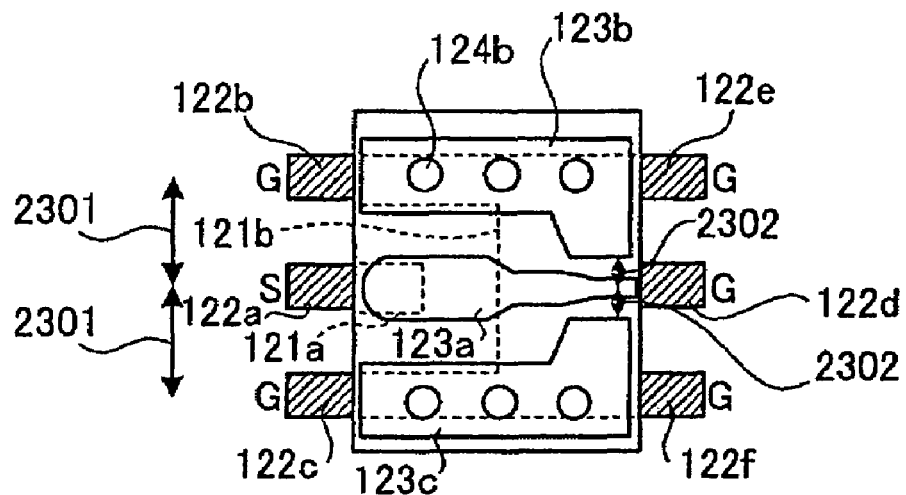
FIG. 23 is a plan view showing a relay substrate according to the sixth modification of the embodiment.

FIG. 23 is a plan view showing a relay substrate according to the sixth modification of the embodiment. Referring to FIG. 23, the same structure as that shown in FIG. 2 is designated by the same reference numeral and a description thereof is omitted. Referring to FIG. 23, on the relay substrate 120 according to the sixth modification of the embodiment, different pitches are formed, including a pitch 2301 between the signal line 121a and the ground plane 121b connected to the printed circuit board 110 and a pitch 2302 between the signal line 123a connected to the flexible printed circuit 130 and the ground plane 123b and ground plane 123c.

In the example, the ground plane 123b and the ground plane 123c are formed as a coplanar line to be close to the signal line 123a, thereby reducing the size of the pitch 2302 as compared with that of the pitch 2301. Alternatively, the ground plane 121b may forme as a coplanar line to be close to the signal line 121a, thereby reducing the size of the pitch 2301 as compared with that of the pitch 2302.

Figure 24:
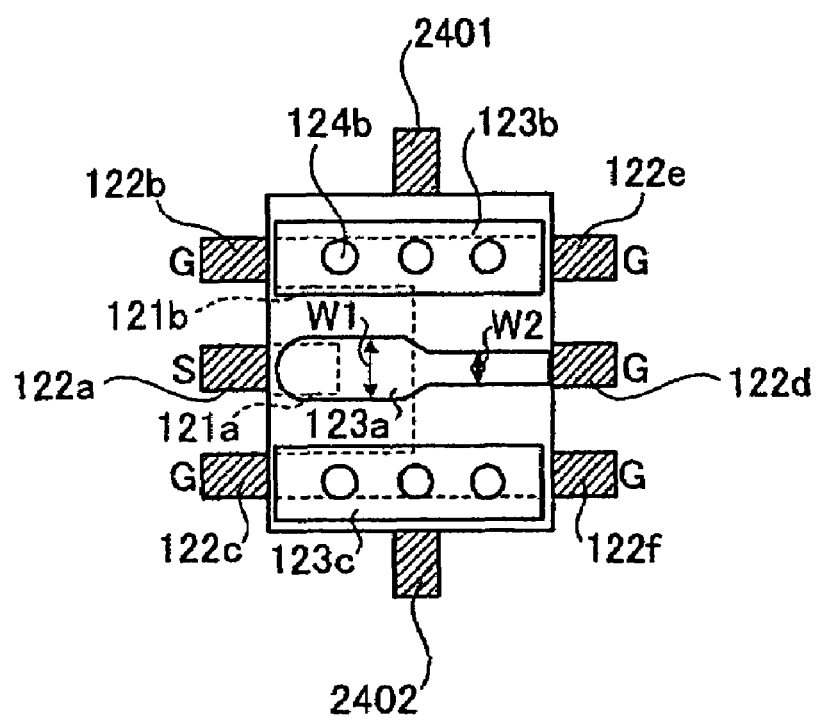
FIG. 24 is a plan view showing a relay substrate according to the seventh modification of the embodiment.

FIG. 24 is a plan view showing a relay substrate according to the seventh modification of the embodiment. Referring to FIG. 24, the same structure as that shown in FIG. 2 is designated by the same reference numeral and a description thereof is omitted. Referring to FIG. 24, the relay substrate 120 according to the seventh modification of the embodiment comprises lead terminals 2401 and 2402 (lead terminals for positioning). The lead terminals 2401 and 2402 are individually arranged to two sides of the relay substrate 120, on which the signal lead terminal 122a and the ground lead terminal 122b to 122f are not arranged.

Arrangement portions of the lead terminals 2401 and 2402 on the printed circuit board 110 are marked, the lead terminals 2401 and 2402 are used as positioning members for arranging the relay substrate 120 onto the printed circuit board 110. Accordingly, it is easy to perform the positioning operation of the relay substrate 120 on the printed circuit board 110.

Further, the lead terminals 2401 and 2402 arranged to the relay substrate 120 may be fixed to the printed circuit board 110. Accordingly, it is possible to improve the intensity of the connection portion between the printed circuit board 110 and the relay substrate 120 in the arrangement direction of the lead terminals 2401 and 2402 and to prevent the positional deviation in this direction.

Figure 25:
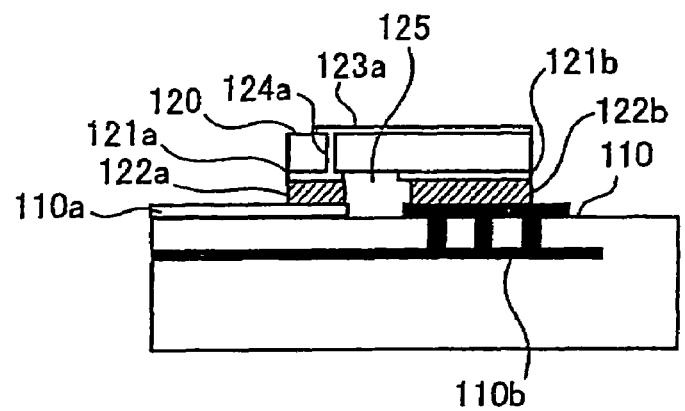
FIG. 25 is a longitudinal front view showing a relay substrate according to the eighth modification of the embodiment.

FIG. 25 is a longitudinal front view showing a relay substrate according to the eighth modification of the embodiment. Referring to FIG. 25, the same structure as that shown in FIG. 3 is designated by the same reference numeral and a description thereof is omitted. As shown in FIG. 25, on the relay substrate 120 according to the eighth modification of the embodiment, the signal lead terminal 122a and the ground lead terminal 122b (similarly to the ground lead terminals 122c to 122f (not shown)) may be arranged to prevent the position thereof from being out of the outer-shape of the relay substrate 120.

With this structure, it is possible to reduce the attachment area of the relay substrate 120 on the printed circuit board 110. Accordingly, the size of the printed circuit board 110 can be reduced. Further, the relay substrate 120 can be connected just to the end of the printed circuit board 110. Thus, the printed circuit board 110 can stably obtain preferable characteristics.

Figure 26:
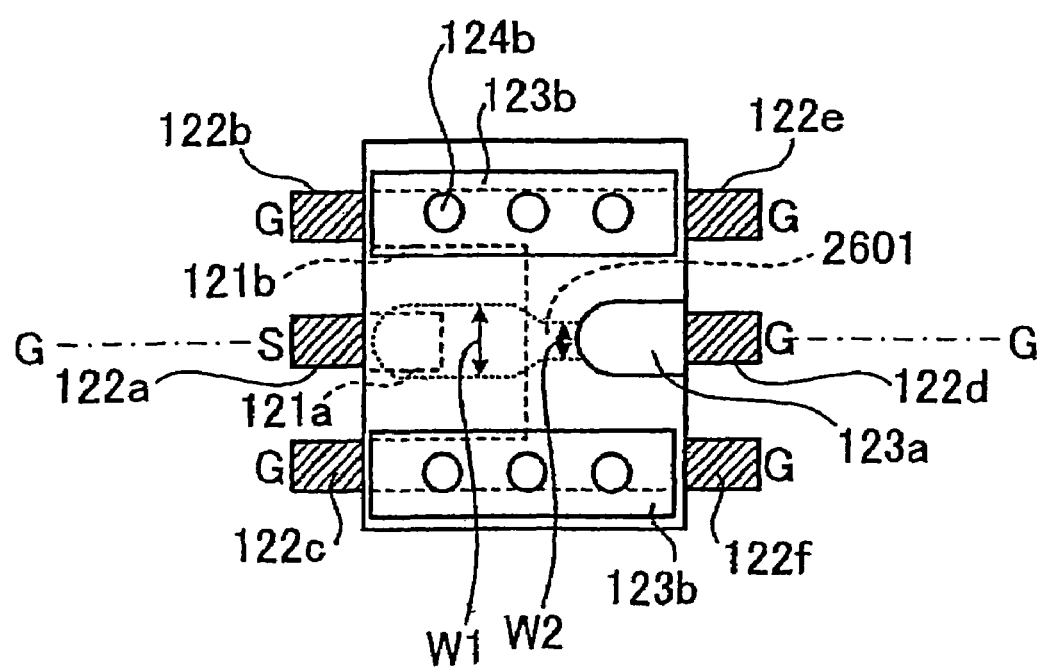
FIG. 26 is a plan view showing a relay substrate according to the ninth modification of the embodiment.

FIG. 26 is a plan view showing a relay substrate according to the ninth modification of the embodiment. Referring to FIG. 26, the same structure as that shown in FIG. 2 is designated by the same reference numeral and a description thereof is omitted. As shown by a dotted line in FIG. 26, the relay substrate 120 according to the ninth modification of the embodiment has a strip-line structure for passing a signal line 2601 therethrough. With this structure, it is possible to use the connection using the thicker relay substrate 120.

Figure 27:
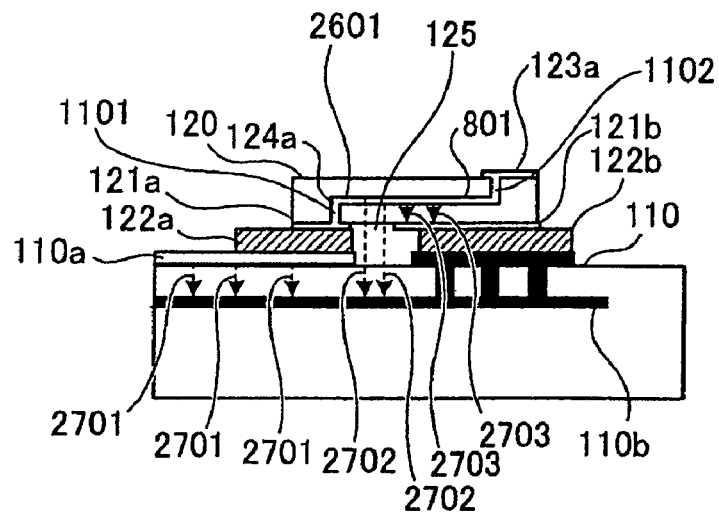
FIG. 27 is a cross-sectional view showing a cross-section of a G-G line in FIG. 26 and the printed circuit board.

FIG. 27 is a cross-sectional view showing a cross-section of a G-G line in FIG. 26 and the printed circuit board. Referring to FIG. 27, the same structure as that shown in FIG. 11 is designated by the same reference numeral and a description thereof is omitted. As shown in FIG. 27, the signal line 121a on the bottom face of the relay substrate 120 is connected to one end of the signal line 2601 passing through the relay substrate 120 via the via-hole 1101. The other end of the signal line 2601 is connected to the signal line 123a on the surface of the relay substrate 120 via the via-hole 1102.

As shown by reference numeral 2701, the signal line 110a on the printed circuit board 110 forms a microstrip line, corresponding to the ground line 110d in the printed circuit board 110. Further, as shown by reference numeral 2702, at the portion where the ground plane 121b is not formed on the bottom face of the relay substrate 120, of the signal line 2601 passing through the relay substrate 120, a microstrip line is formed, corresponding to the ground line 110b on the surface of the printed circuit board 110.

Further, as shown by reference numeral 2703, at the portion where the ground plane 121b is formed on the bottom face of the relay substrate 120, of the signal line 2601 passing through the relay substrate 120, a microstrip line is formed, corresponding to the ground plane 121b on the bottom face of the relay substrate 120. The signal line 2601 has a width corresponding to the distance to the corresponding ground plane. Herein, the width of the signal line 110a on the printed circuit board 110 keeps the impedance characteristic to 50Ω between the signal line 110a and the ground line 110d in the printed circuit board 110.

Further, at the portion where the ground plane 121b is not formed on the bottom face of the relay substrate 120, of the signal line 2601 passing through the relay substrate 120, the width W1 keeps the impedance characteristic to 50Ω between the signal line 2601 and the ground line 110b on the surface of the printed circuit board 110. Furthermore, at the portion where the ground plane 121b is formed on the bottom face of the relay substrate 120, of the signal line 2601 passing through the relay substrate 120, the width W2 keeps the impedance characteristic to 50Ω between the signal line 2601 and the ground plane 121b on the bottom face of the relay substrate 120.

The distance to the signal line 123a and the ground line 110b shown by reference numeral 2702 is longer than the distance between the signal line 123a and the ground plane 121b, shown by reference numeral 2703. Therefore, in order to always keep, to 50Ω, the impedance characteristic of the microstrip line from the signal line 110a on the printed circuit board 110 to the signal line 123a on the surface of the relay substrate 120, the width W2 of the portion shown by reference numeral 2702 of the signal line 2601 passing through the relay substrate 120 is narrower than the width W1 of a portion shown by reference numeral 2703 (refer to FIG. 26).

Figure 28:
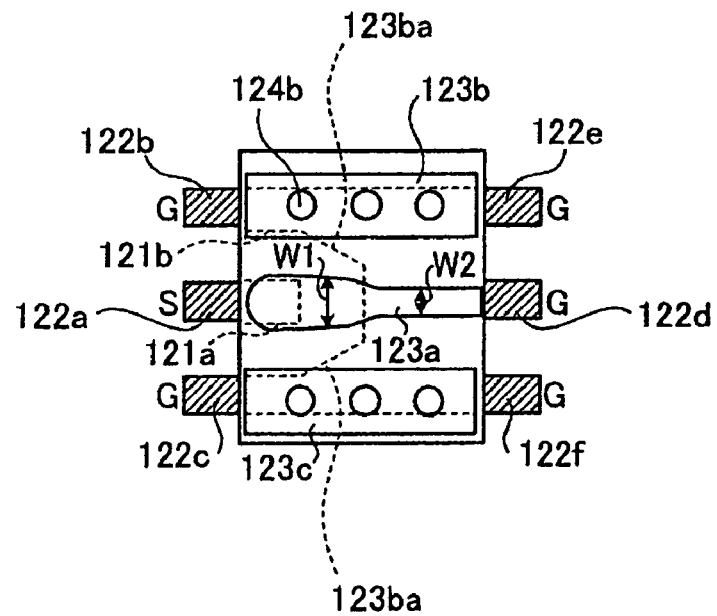
FIG. 28 is a plan view showing a relay substrate according to the tenth modification of the embodiment.

FIG. 28 is a plan view showing a relay substrate according to the tenth modification of the embodiment. Referring to FIG. 28, the same structure as that shown in FIG. 2 is designated by the same reference numeral and a description thereof is omitted. As shown in FIG. 28, the ground plane 121b on the bottom face of the relay substrate 120 according to the tenth modification of the embodiment has an inclined portion 123ba in a C-shaped portion surrounding the signal line 121a. With this structure, the characteristics of the printed circuit board 110 can be improved.

Figure 29:
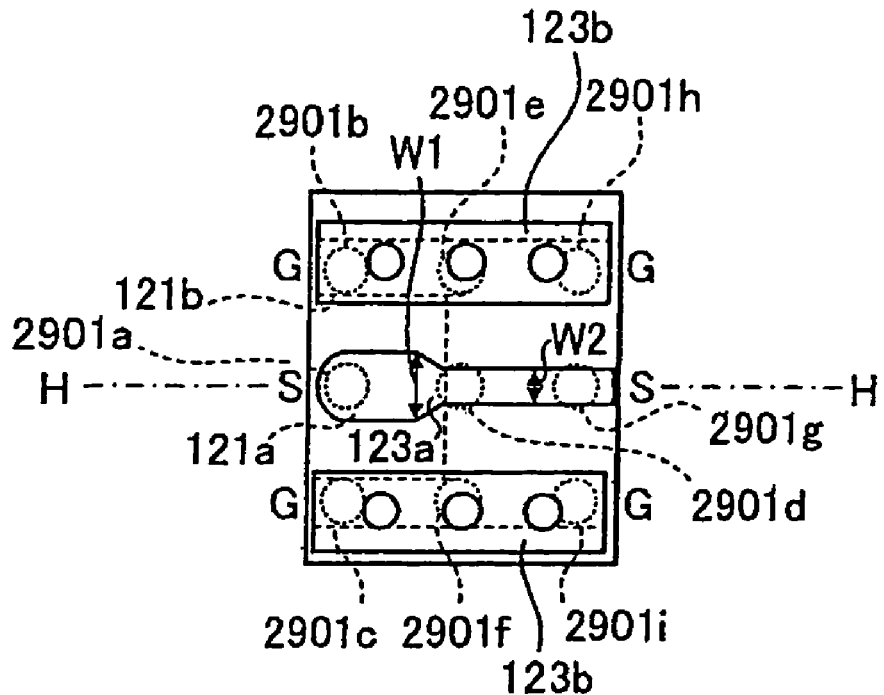
FIG. 29 is a plan view showing a relay substrate according to the eleventh modification of the embodiment.

FIG. 29 is a plan view showing a relay substrate according to the eleventh modification of the embodiment. Referring to FIG. 29, the same structure as that shown in FIG. 2 is designated by the same reference numeral and a description thereof is omitted. As shown in FIG. 29, the relay substrate 120 according to the eleventh modification of the embodiment is connected to the printed circuit board 110 via a conductive ball 2901a to a conductive ball 29011.

The conductive ball 2901a is connected to the signal line 121a on the relay substrate 120 and the signal line 110a on the printed circuit board 110. The conductive balls 2901b to 2901i are connected to the ground plane 121b on the relay substrate 120, the ground line 110b on the printed circuit board 110, the ground line 110c, or the ground line 110d.

Figure 30:
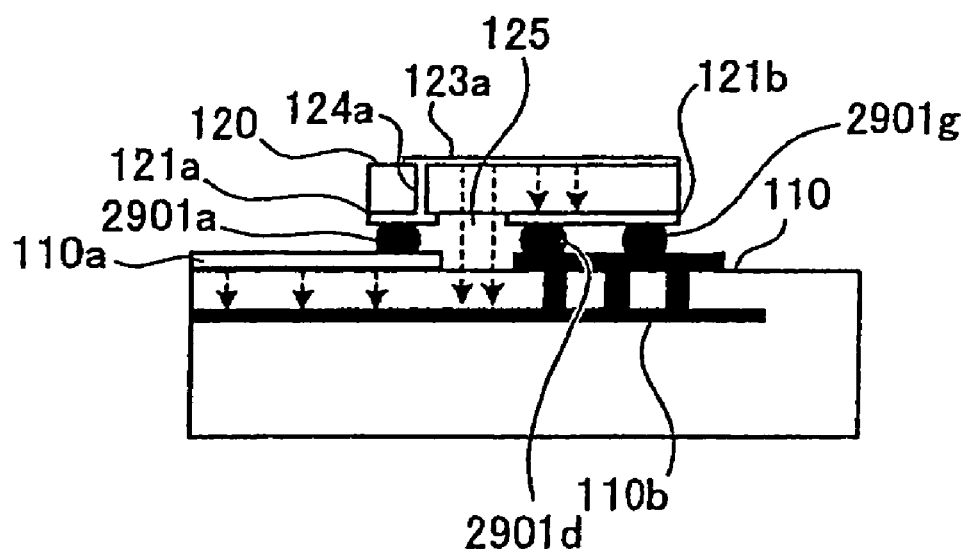
FIG. 30 is a cross-sectional view showing a cross-section of an H-H line in FIG. 29 and the printed circuit board.

FIG. 30 is a cross-sectional view showing a cross-section of an H-H line in FIG. 29 and the printed circuit board. Referring to FIG. 30, the same structure as that shown in FIG. 5 is designated by the same reference numeral and a description thereof is omitted. As shown in FIG. 30, the conductive balls 2901a to 2901i have a predetermined thickness. The conductive balls 2901a to 2901i are, e.g., soldering balls. The conductive balls 2901a to 2901i are connected to the relay substrate 120 and the printed circuit board 110 by soldering.

Figure 31:
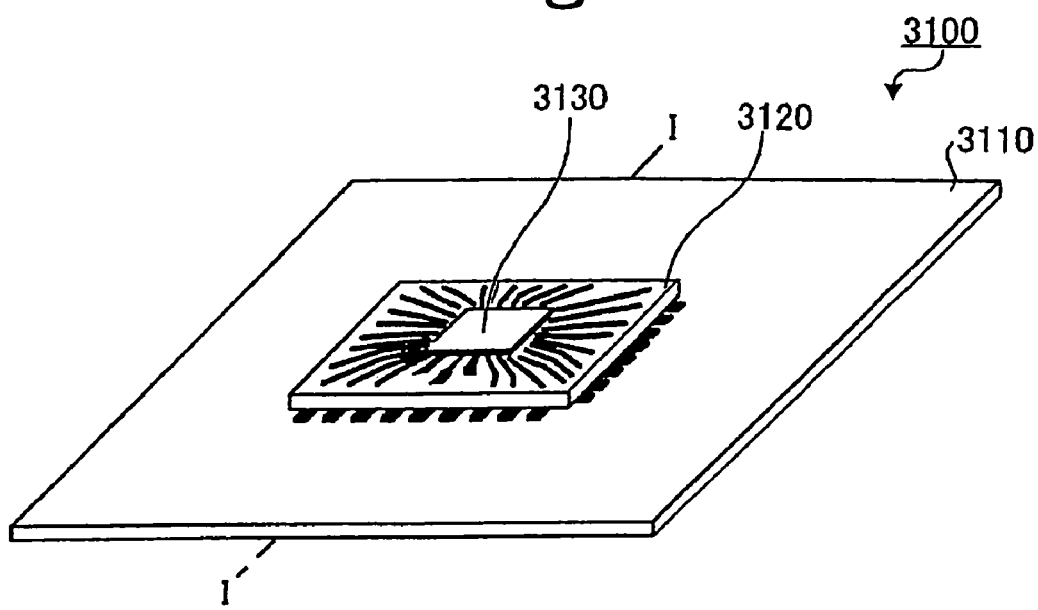
FIG. 31 is a perspective view showing an IC package using a relay substrate according to the embodiment.

FIG. 31 is a perspective view showing an IC package using the relay substrate according to the embodiment. An IC package 3130 using the relay substrate 120 according to the embodiment comprises: a printed circuit board 3110; a relay substrate 3120; and an IC 3130. The printed circuit board 3110 is similar to the printed circuit board 110. The various relay substrates 120 can be used as the relay substrate 3120.

Figure 32:
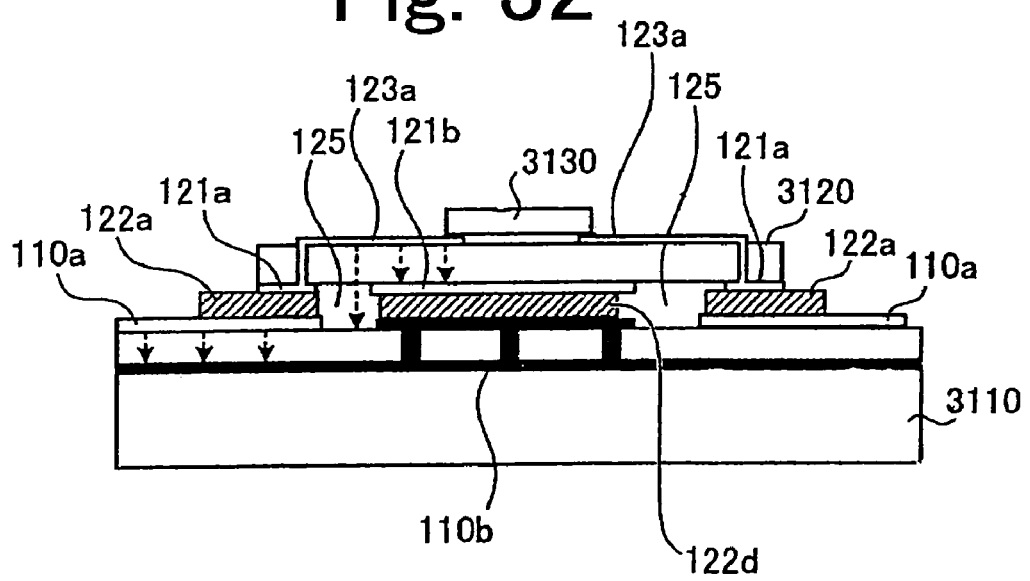
FIG. 32 is a cross-sectional view showing an I-I line in FIG. 31.

FIG. 32 is a cross-sectional view showing an I-I line in FIG. 31. Referring to FIG. 32, the same structure as that shown in FIG. 5 is designated by the same reference numeral and a description thereof is omitted. As shown in FIG. 32, a signal line of the IC 3130 is connected to the signal line 123a on the relay substrate 3120 by soldering. Although not shown, the ground plane of the IC 3130 is connected to the ground plane 123b and the ground plane 123c on the relay substrate by soldering.

As mentioned above, in order to set, to be constant, the impedance characteristic of the microstrip line from the signal line 110a on the printed circuit board 110 to the signal line 123a on the relay substrate 120, the signal line and the ground plane are formed. With this structure, it is possible to improve the transfer characteristics of a high-velocity signal between the IC 3130 and the printed circuit board 3110. The relay substrate 120 according to the embodiment can be used to the connection between a multi-layered substrate and an IC in addition to the connection between the multi-layered substrates.

Figure 33:
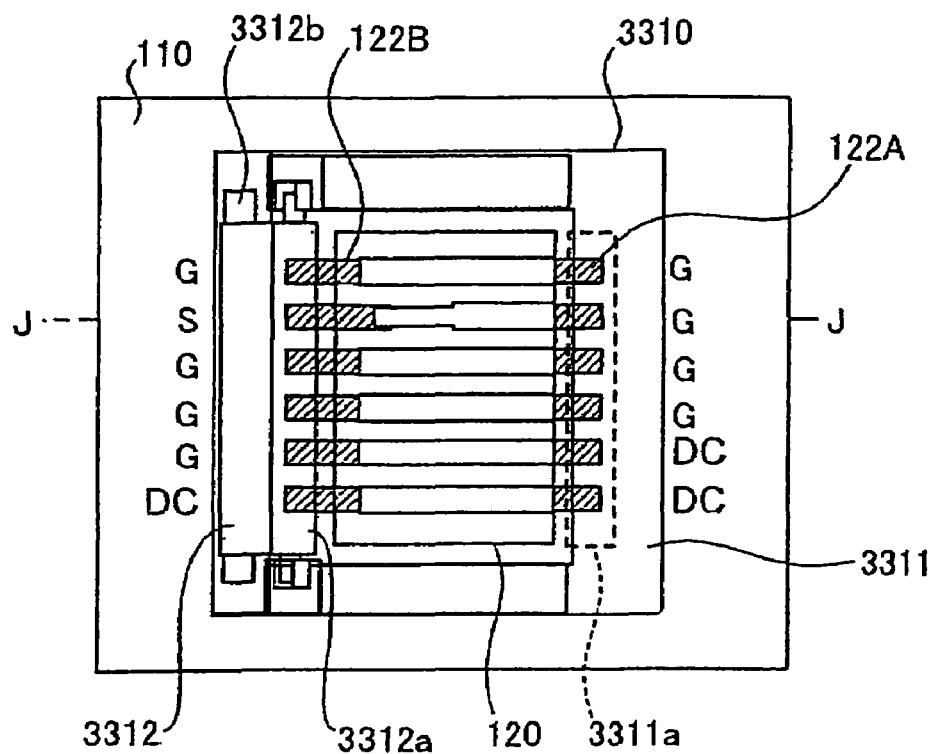
FIG. 33 is a plan view showing a printed circuit board using a relay substrate according to the embodiment.
Figure 34:
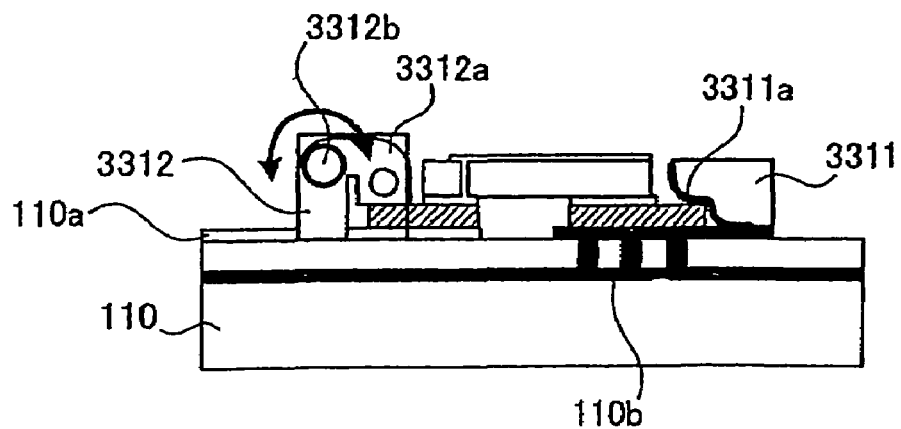
FIG. 34 is a cross-sectional view showing a J-J line in FIG. 33.

FIG. 33 is a plan view showing a printed circuit board using a relay substrate according to a modification of the embodiment. FIG. 34 is a cross-sectional view showing a J-J line in FIG. 33. Referring to FIGS. 33 and 34, the same structure as that shown in FIG. 5 is designated by the same reference numeral and a description thereof is omitted. As shown in FIG. 33, the printed circuit board 110 using the relay substrate 120 according to the first modification of the embodiment has a socket 3310 (fixing mechanism) in addition to the structure shown in FIG. 5.

The socket 3310 comprises a plug portion 3311, and a Pin pressing portion 3312. The plug portion 3311 includes a plug port 3311a for plug-in of a plurality of lead terminals 122A included in one side of the relay substrate 120, and fixes the plurality of lead terminals 122A included in one side of the relay substrate 120 to the printed circuit board 110.

The Pin pressing portion 3312 includes a fixing clip 3312a that is rotated with an axis 3312b as center in an arrow direction in the drawing. The fixing clip 3312a fixes a plurality of lead terminals 122B of another side of the relay substrate 120 to the printed circuit board 110. Further, the fixing clip 3312a releases the plurality of lead terminals 122B by the rotation in the arrow direction in the drawing to detach the lead terminals 122B from the printed circuit board 110.

With this structure, the socket 3310 included in the printed circuit board 110 can detachably fix the plurality of lead terminals 122A and 122B on the relay substrate 120. Further, the socket 3310 performs the positioning to the printed circuit board 110 of the relay substrate 120.

Accordingly, the relay substrate 120 can easily be fixed to the printed circuit board 110. Further, if the relay substrate 120 is detached from the printed circuit board 110, there is no damage. Therefore, the detached relay substrate 120 can be reconnected to the printed circuit board 110 or another multi-layered substrate.

Figure 35:
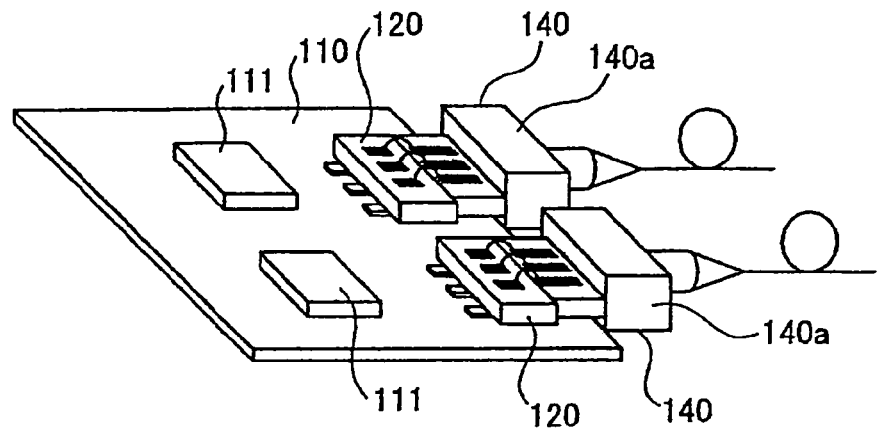
FIG. 35 is a perspective view showing an optical device directly connected to a relay substrate according to the embodiment.

FIG. 35 is a perspective view showing an optical device directly connected to the relay substrate according to the embodiment. Referring to FIG. 35, the same structure as that shown in FIG. 1 is designated by the same reference numeral and a description thereof is omitted. As shown in FIG. 35, the optical device 140 is directly connected to the relay substrate 120, not via the flexible printed circuit 130.

Figure 36:
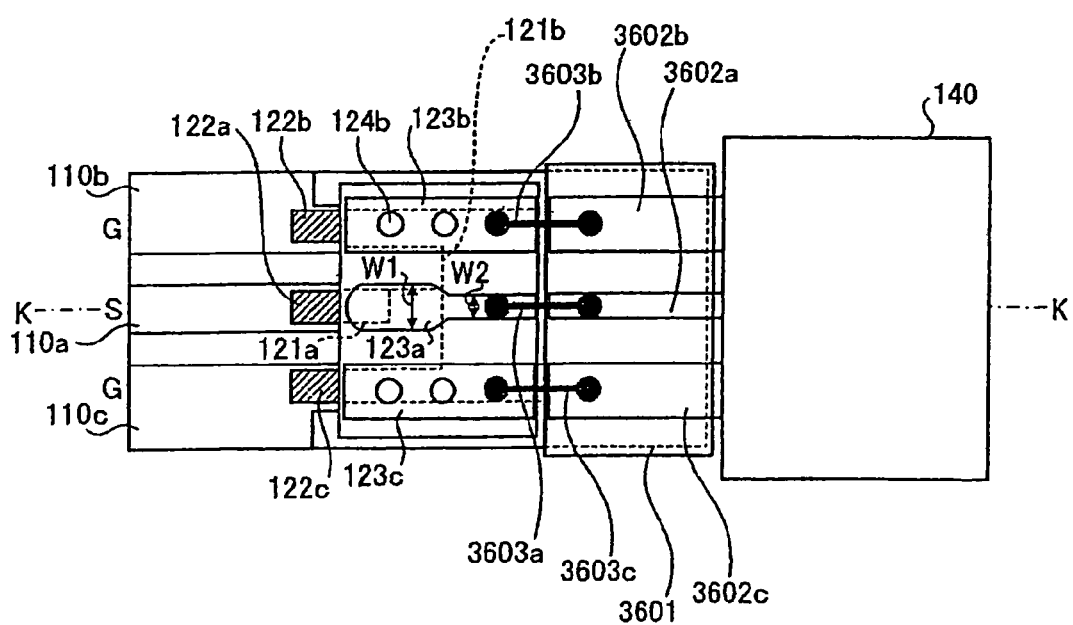
FIG. 36 is a plan view showing an optical device directly connected to a relay substrate according to the embodiment.
Figure 37:
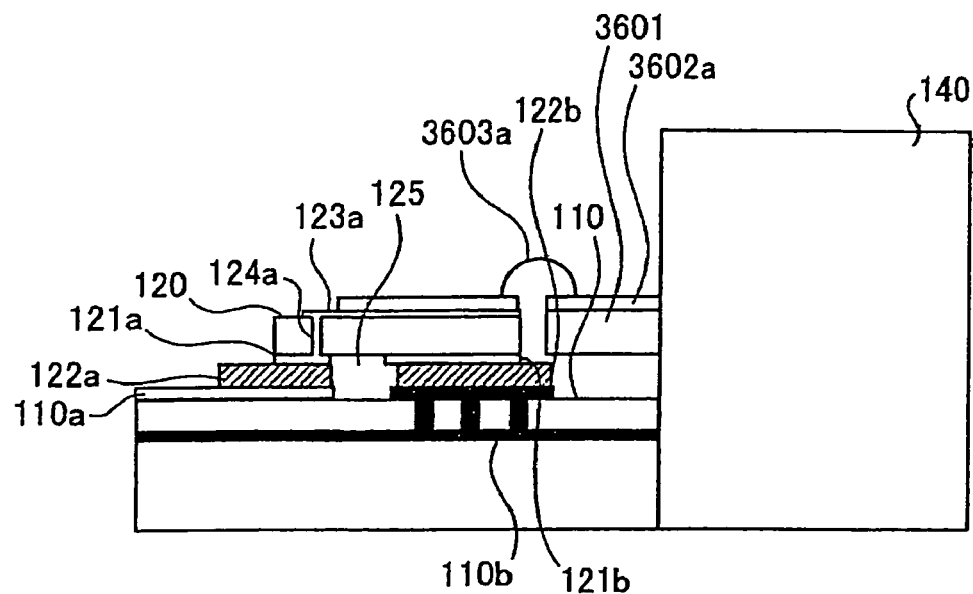
FIG. 37 is a cross-sectional view showing a K-K line in FIG. 36.

FIG. 36 is a plan view showing an optical device directly connected to the relay substrate according to the embodiment. FIG. 37 is a cross-sectional view showing a K-K line in FIG. 36. Referring to FIGS. 36 and 37, the same structure as that shown in FIGS. 4 and 5 is designated by the same reference numeral and a description thereof is omitted. As shown in FIG. 36, the optical device 140 comprises a substrate 3601 for connection. On the surface of the substrate 3601, a signal line 3602a and a ground line 3602b and a ground line 3602c for sandwiching the signal line 3602a are formed.

The signal line 3602a, the ground line 3602b, and the ground line 3602c form a coplanar line. The signal line 3602a of the optical device 140 is connected to the signal line 123a on the relay substrate 120 via a wire 3603a. The ground line 3602b of the optical device 140 is connected to the ground plane 123b of the relay substrate 120 via a wire 3603b. The ground line 3602c of the optical device 140 is connected to the ground plane 123c of the relay substrate 120 via a wire 3603c.

The relay substrate 120 is a ceramic substrate that can be processed up to the end of the substrate and the positional precision of an electrode can be ensured. Therefore, it is possible to reduce the lengths (e.g., 200 μm or less) of the wires 3602a to 3602c for connecting the relay substrate 120 to the optical device 140. Therefore, characteristics of fast transfer, such as 20 Gbps and 40 Gbps, can be ensured.

Figure 38:
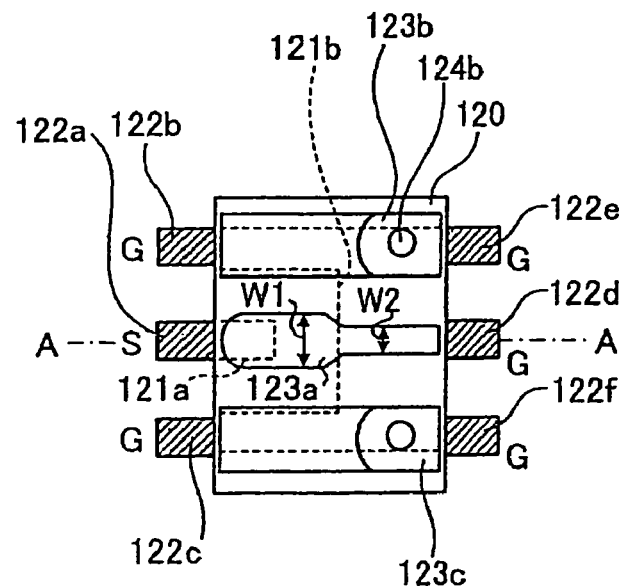
FIG. 38 is a plan view showing a relay substrate according to the twelfth modification of the embodiment.

FIG. 38 is a plan view showing a relay substrate according to the twelfth modification of the embodiment. Referring to FIG. 38, the same structure as that shown in FIG. 2 is designated by the same reference numeral and a description thereof is omitted. Referring to FIG. 2, the ground plane 123b and the ground plane 123c on the surface of the relay substrate 120 may be formed by sandwiching the signal line 123a, thereby forming the coplanar line. However, the present invention is not limited to this.

According to the present invention, the microstrip line may be ensured from the signal line 121a to the signal line 123a. As shown in FIG. 38, on the ground plane 123b and the ground plane 123c on the surface of the relay substrate 120, only the connection portion between the ground electrode 134b and the ground electrode 134c on the flexible printed circuit 130 may be formed. With this structure, the impedance characteristic can also be kept.

Figure 39:
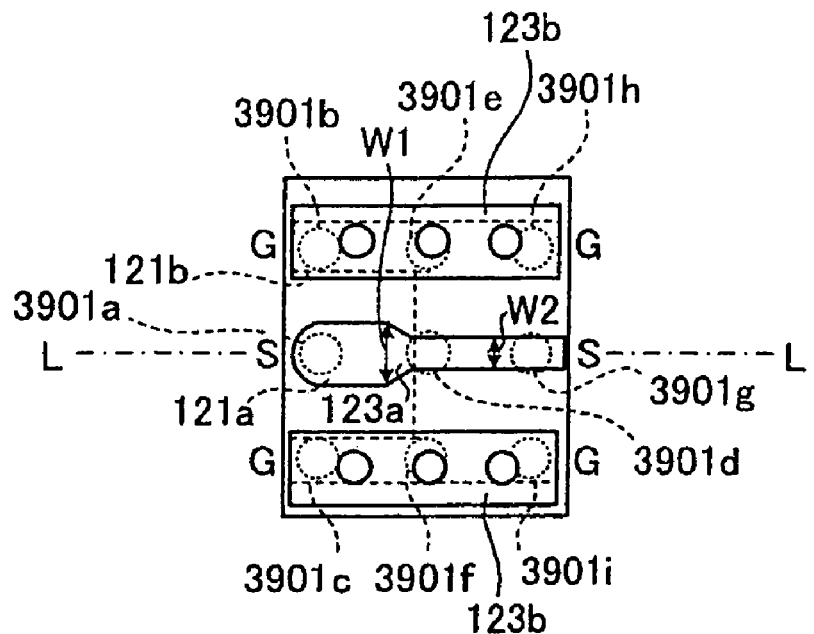
FIG. 39 is a plan view showing a relay substrate according to the thirteenth modification of the embodiment.

FIG. 39 is a plan view showing a relay substrate according to the thirteenth modification of the embodiment. Referring to FIG. 39, the same structure as that shown in FIG. 29 is designated by the same reference numeral and a description thereof is omitted. As shown in FIG. 39, the relay substrate 120 according to the thirteenth modification of the embodiment is connected to the printed circuit board 110 via an LGA (Land Grid Array) 3901a to an LGA 3901i.

The LGA 3901a is connected to the signal line 121a on the relay substrate 120 and the signal line 110a on the printed circuit board 110. The LGA 3901b to LGA 3901i are connected to the ground plane 121b on the relay substrate 120 and the ground line 110b, the ground line 110c, or the ground line 110d in the printed circuit board 110.

Figure 40:
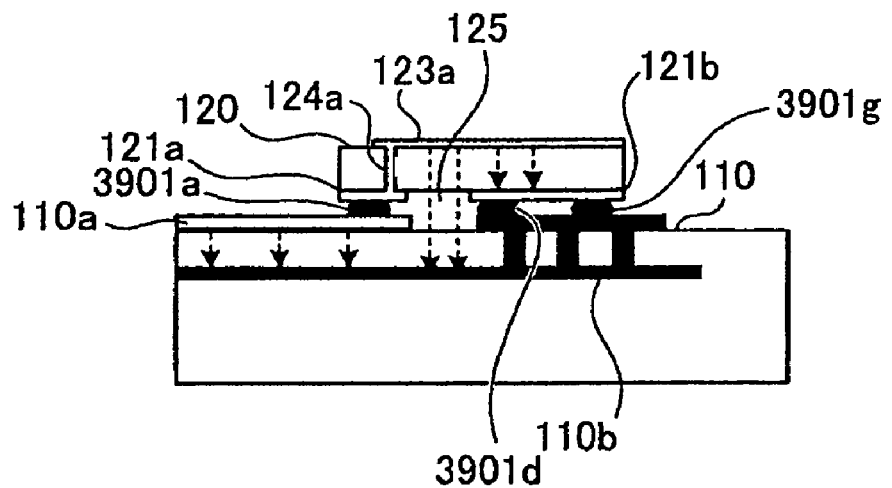
FIG. 40 is a cross-sectional view showing a cross-section of an L-L line in FIG. 39 and a printed circuit board.

FIG. 40 is a cross-sectional view of a cross-section of an L-L line shown in FIG. 39 and the printed circuit board. Referring to FIG. 40, the same structure as that shown in FIG. 30 is designated by the same reference numeral and a description thereof is omitted. As shown in FIG. 40, the LGA 3901a to LGA 3901i have a predetermined thickness. The LGA 3901a to LGA 3901i are connected to the relay substrate 120 and the printed circuit board 110 by soldering.

Figure 41:
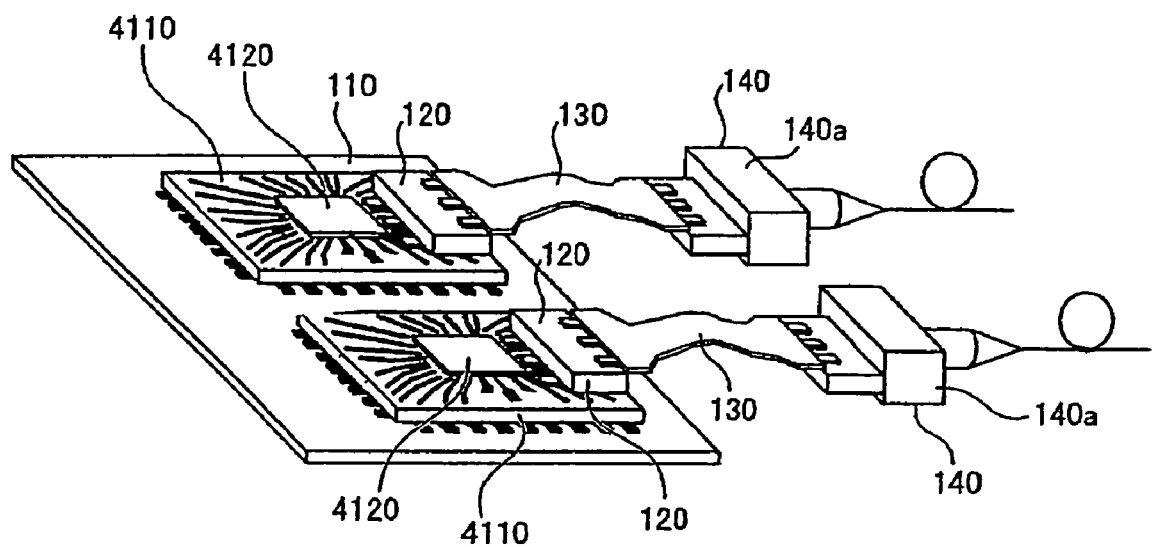
FIG. 41 is a perspective view showing a relay substrate according to the fourteenth modification of the embodiment.

FIG. 41 is a plan view showing a relay substrate according to the fourteenth modification of the embodiment. Referring to FIG. 41, the same structure as that shown in FIG. 1 is designated by the same reference numeral and a description thereof is omitted. Referring to FIG. 41, the relay substrate 120 according to the fourteenth modification of the embodiment may relay the connection between an IC package 4120 having an IC 4120 and another circuit (herein, the optical device 140). In this case, the signal lead terminal 122a on the relay substrate 120 is directly connected to a signal electrode formed onto the IC package 4120.

As mentioned above, with the relay substrate 120 according to the present invention, the flexible printed circuit 130 is connected to the printed circuit board 110 with the distance to the printed circuit board 110 while keeping the impedance characteristic. Therefore, with the relay substrate 120 according to the present invention, the flexible printed circuit 130 can keep the impedance characteristic without the influence from the printed circuit board 110 and it is therefore possible to improve the transfer characteristics of the high-velocity signal.

Further, with the relay substrate 120 according to the present invention, the width of the signal line 123a is changed in the halfway, thereby keeping, to be constant, the impedance characteristic of the microstrip line from the signal line 110a on the printed circuit board 110 to the signal line 123a on the relay substrate 120. Therefore, with the relay substrate 120 according to the present invention, it is possible to improve the transfer characteristics of the high-velocity signal.

Furthermore, with the relay substrate 120 according to the present invention, the relay substrate 120 is connected to the printed circuit board 110 via the signal lead terminal 122a and the ground lead terminal 122b having the thickness. Therefore, if detaching the relay substrate 120 and the flexible printed circuit 130 from the printed circuit board 110, the damage is small. Therefore, the detached relay substrate 120 and flexible printed circuit 130 can be reconnected to the printed circuit board 110 or another circuit.

With these structures, the width of the signal line is changed in the halfway. Thus, the impedance characteristic is kept and the thickness of the substrate material causes the distance between another multi-layered substrate and the circuit-mounted substrate and another circuit cannot be influenced from the circuit-mounted substrate.

According to the present embodiments, advantageously, it is possible to improve the transfer characteristics of the high-velocity signal between multi-layered substrates.

As mentioned above, a relay substrate and an optical communication module according to the present invention are advantageous for the connection between a printed circuit board and another circuit and, in particular, are suitable for the connection of a high-velocity signal.

What is claimed is:

1. A substrate for connecting circuit boards, comprising:
a substrate member having a first surface and a second surface facing each other and a first end and a second end facing each other;
a first signal line formed on the first surface;
a second signal line formed on the second surface;
a third signal line connecting the first signal line with the second signal line;
a first ground plane arranged on the first surface and surrounding the first signal line; and
a portion of the second signal line formed over the first ground plane, the portion being narrower than another portion of the second signal line.

2. A substrate of claim 1, further comprising a second ground plane arranged on the second surface and associated with the second signal line.

3. A substrate of claim 1, wherein the first signal line extends from the first end to the third signal line.

4. A substrate of claim 1, wherein the third signal line is a via-hole.

5. A substrate of claim 1, wherein the third signal line comprises a fourth signal line arranged between the first surface and the second surface and having ends, a first via-hole arranged between the first surface and one end of the fourth signal line, and a second via-hole arranged between the second surface and the other end of the fourth signal line.

6. A substrate assembly, comprising;
a first circuit board having a first circuit board signal line;
a second circuit board having a second circuit board signal line; and
a relay substrate comprising
a first signal line formed on the first surface;
a second signal line formed on the second surface;
a third signal line connecting the first signal line with the second signal line;
a first ground plane arranged on the first surface and surrounding the first signal line; and
a portion of the second signal line formed over the first ground plane, the portion being narrower than another portion of the second signal line.

* * * * *